(12) United States Patent
Chu et al.

(10) Patent No.: US 12,557,335 B2
(45) Date of Patent: Feb. 17, 2026

(54) TRANSISTOR STRUCTURE

(71) Applicant: Taiwan Semiconductor Manufacturing Company, Hsinchu (TW)

(72) Inventors: Chen-Liang Chu, Hsinchu (TW); Chien-Chih Chou, New Taipei (TW); Ta-Yuan Kung, New Taipei (TW); Chun-Hsun Lee, Hsinchu (TW); Chih-Wen Yao, Hsinchu (TW); Yi-Huan Chen, Hsinchu (TW); Ming-Ta Lei, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 546 days.

(21) Appl. No.: 18/093,420

(22) Filed: Jan. 5, 2023

(65) Prior Publication Data

US 2024/0186408 A1 Jun. 6, 2024

Related U.S. Application Data

(60) Provisional application No. 63/385,952, filed on Dec. 2, 2022.

(51) Int. Cl.
  *H10D 30/66* (2025.01)
  *G09G 3/36* (2006.01)
  *H01L 21/762* (2006.01)
  *H10D 64/01* (2025.01)
  (Continued)

(52) U.S. Cl.
  CPC .......... *H10D 30/668* (2025.01); *G09G 3/3696* (2013.01); *H01L 21/76224* (2013.01); *H10D 64/027* (2025.01); *H10D 84/0151* (2025.01); *H10D 84/038* (2025.01)

(58) Field of Classification Search
  CPC ...... H10D 30/668; H10D 30/62; H10D 30/60; H10D 62/292; H10D 64/513
  See application file for complete search history.

(56) References Cited

U.S. PATENT DOCUMENTS

2014/0332880 A1   11/2014   Kim
2021/0210534 A1*   7/2021   Chen .................... H10D 64/518

FOREIGN PATENT DOCUMENTS

CN   113764516 A   12/2021
TW   202127547 A    7/2021

OTHER PUBLICATIONS

Taiwan Office Action: Application No. 11320774220 Dated: Aug. 1, 2024.

(Continued)

*Primary Examiner* — Fernando L Toledo
*Assistant Examiner* — Adam S Bowen
(74) *Attorney, Agent, or Firm* — Lippes Mathias LLP

(57) ABSTRACT

Transistors with improved saturation drain current and methods for making such transistors are disclosed. The gate is formed in the shape of a longitudinal trench and a plurality of lateral trenches below the longitudinal trench. The resulting dual-recess structure increases the surface area of the gate, which permits additional charge carriers and increases the saturation drain current of the transistor. Such transistors can be useful in high voltage and medium voltage applications such as in display driver integrated circuits.

20 Claims, 27 Drawing Sheets

(51) Int. Cl.
*H10D 84/01* (2025.01)
*H10D 84/03* (2025.01)

(56) References Cited

OTHER PUBLICATIONS

Taiwan Office Action for Application No. 11420072770 Dated Jan. 20, 2025.

* cited by examiner

Control Device

Experimental Device

US 12,557,335 B2

TRANSISTOR STRUCTURE

PRIORITY CLAIM AND CROSS-REFERENCE

This application claims priority to U.S. Provisional Patent Application Ser. No. 63/385,952, filed on Dec. 2, 2022, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

Applications for semiconductor devices include display driver integrated circuits (DDIC) and touch and display driver integration (TDDI) circuits where high voltage, medium voltage, and low voltage components are integrated onto the same chip. However, process integration can become difficult when applying specific processes at the same time to components for handling different voltages, as such processes may affect the operation of different voltage components in different ways.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a plan view. FIG. 4B is a perspective view along an X-axis shown by line B-B of FIG. 4A. FIG. 4C is a cross-sectional view along the Y-axis shown by line C-C of FIG. 4A.

FIG. 8A is a perspective view along the X-axis. FIG. 8B is a cross-sectional view along the Y-axis.

FIG. 9A is a perspective view along the X-axis. FIG. 9B is a cross-sectional view along the Y-axis.

FIG. 10A is a perspective view along the X-axis. FIG. 10B is a cross-sectional view along the Y-axis.

FIG. 11A is a plan view. FIG. 11B is a perspective view along the X-axis. FIG. 11C is a cross-sectional view along the Y-axis.

FIG. 13A is a perspective view along the X-axis. FIG. 13B is a cross-sectional view along the Y-axis.

FIG. 14A is a perspective view along the X-axis. FIG. 14B is a cross-sectional view along the Y-axis.

FIG. 16A is a plan view. FIG. 16B is a perspective view along the X-axis. FIG. 16C is a cross-sectional view along the Y-axis. FIG. 16D is a cross-sectional view along the Y-axis showing the lateral trenches tapering downwards.

FIG. 17A is a perspective view along the X-axis. FIG. 17B is a cross-sectional view along the Y-axis.

FIG. 18A is a perspective view along the X-axis. FIG. 18B is a cross-sectional view along the Y-axis.

FIG. 19A is a perspective view along the X-axis. FIG. 19B is a cross-sectional view along the Y-axis.

FIG. 20A is a perspective view along the X-axis. FIG. 20B is a cross-sectional view along the Y-axis.

FIG. 21A is a perspective view along the X-axis. FIG. 21B is a cross-sectional view along the Y-axis.

DETAILED DESCRIPTION

Figure 1A:
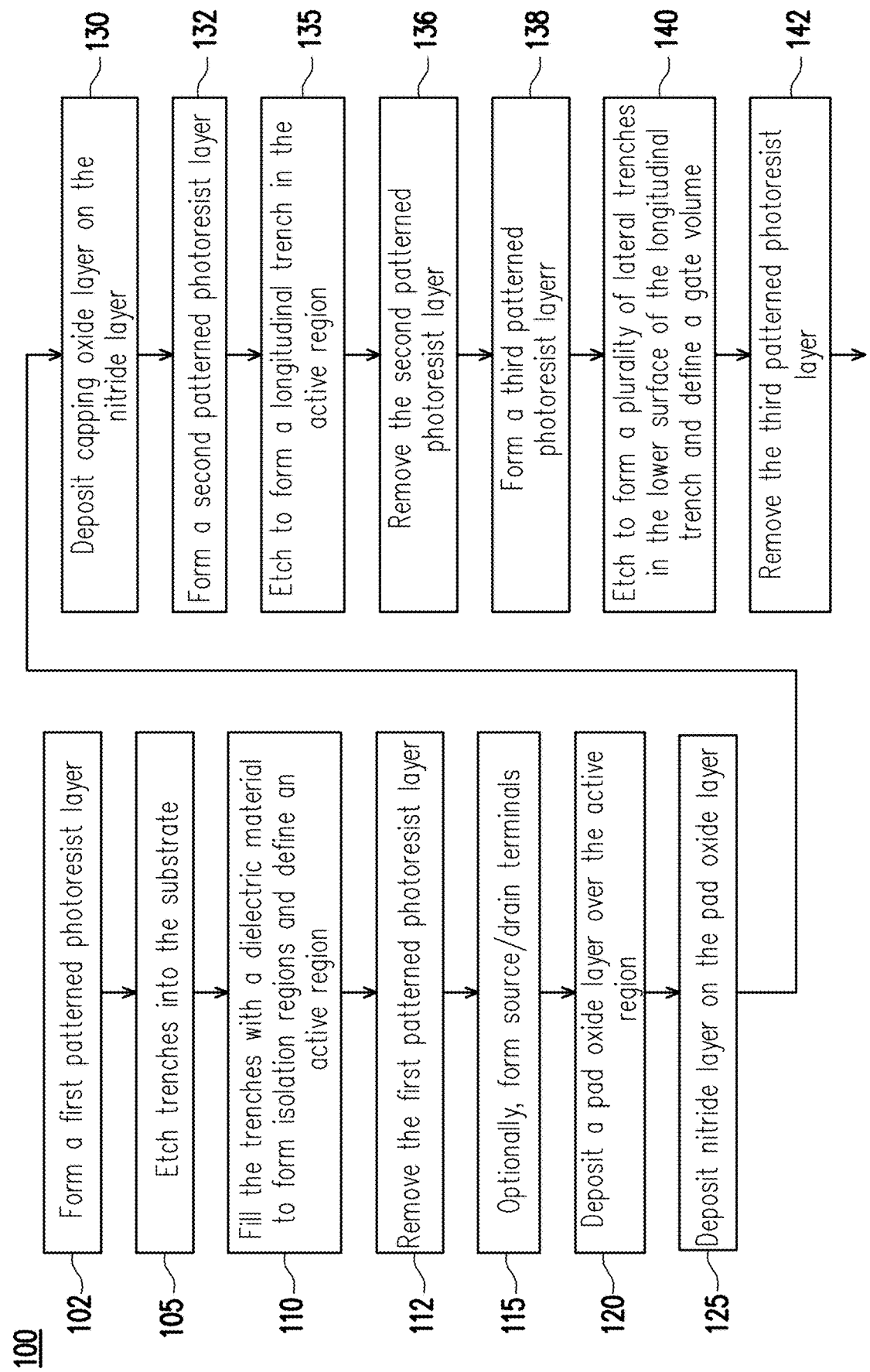
FIG. 1A and FIG. 1B together form a flow chart illustrating a method for increasing the saturation drain current of a transistor, in accordance with some embodiments. This is done by shaping the gate to include a "dual recess" structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them.

The term "parallel" is used herein generally to describe two structures oriented in the same direction. This term should not be interpreted in a strict mathematical way requiring the two structures to never intersect with each other.

Embodiments of the present disclosure relates to various methods for increasing the saturation drain current ($I_{dsat}$) of a transistor. Generally, this value measures the relationship between the current that flows through the semiconductor channel of the transistor and the gate voltage. A higher value is more desirable, and also correlates to higher chip speed. The transistors include a gate terminal which has a dual recess structure. Such transistors may be useful in display driver integrated circuits (DDIC) and touch and display driver integration (TDDI) circuits which include components that operate at different voltages.

Figure 1B:
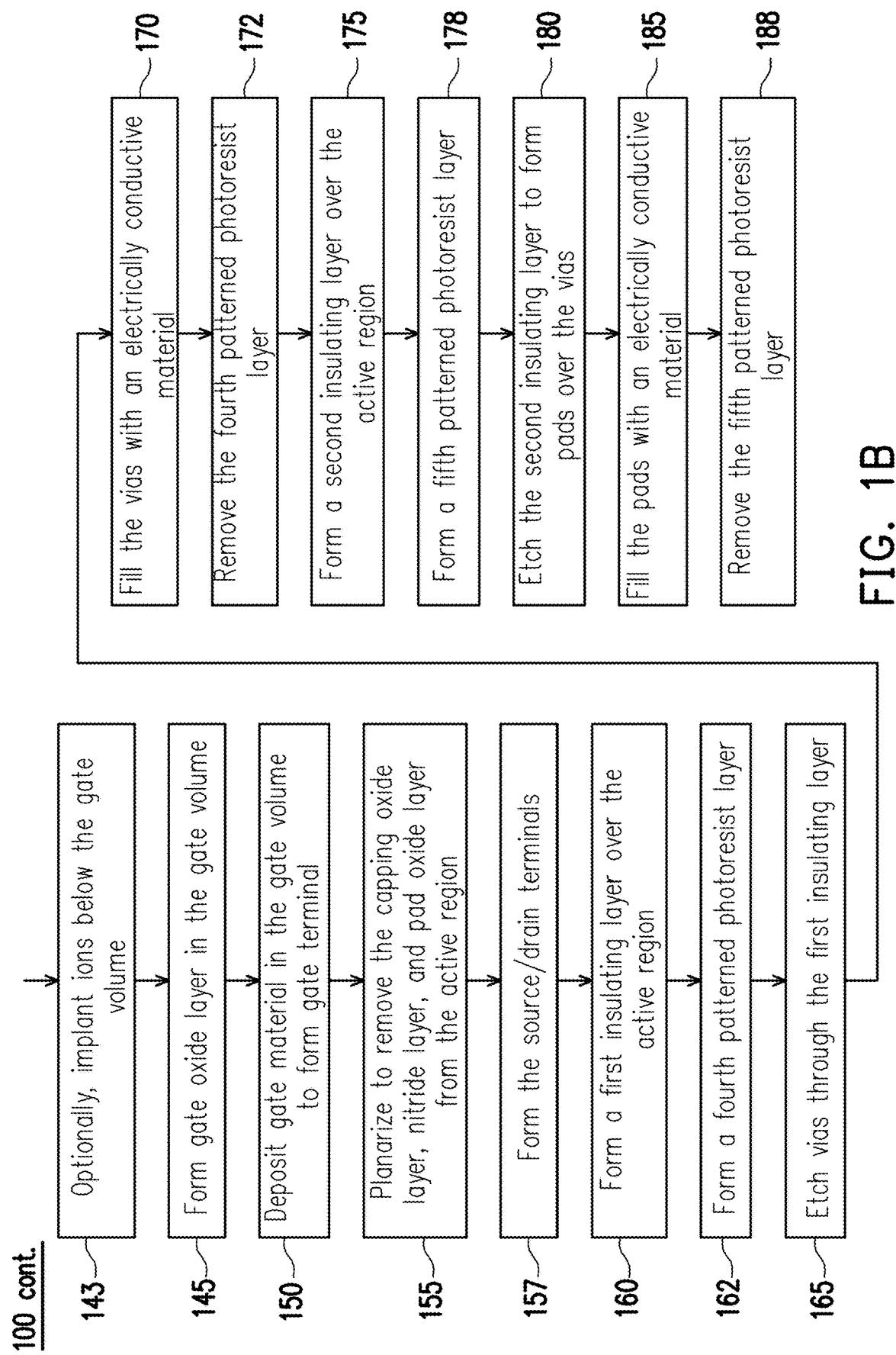

FIG. 1A and FIG. 1B together form a flow chart illustrating a method 100 for reducing the leakage current, in accordance with some embodiments. Some steps of the method are also illustrated in FIGS. 2-23B. These figures provide different views for better understanding.

Figure 2:
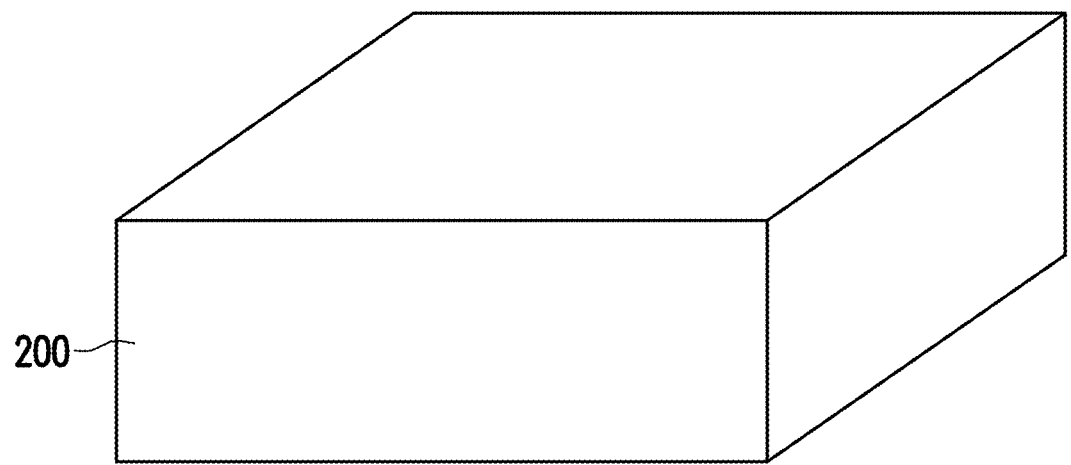
FIG. 2 is a perspective view of a substrate prior to starting the method of FIG. 1.

Referring first to FIG. 2, this figure shows a beginning state of the substrate 200 prior to any processing steps. The substrate is usually a wafer made of a semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon.

Referring now to FIG. 1, in step 102, a first photoresist (PR) layer 201 is applied and patterned. The photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate. The speed of the rotating platen is then increased to spread the resist evenly from the center of the substrate to the perimeter of the substrate. The rotating speed of the platen is then fixed, which can control the thickness of the final photoresist layer.

Next, the photoresist composition is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

The photoresist layer is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. This results in some portions of the photoresist layer being exposed to radiation, and some portions of the photoresist not being exposed to radiation. This exposure causes some portions of the photoresist to become soluble in the developer and other portions of the photoresist to remain insoluble in the developer.

An additional photoresist bake step (post exposure bake, or PEB) may occur after the exposure to radiation. For example, this may help in releasing acid leaving groups (ALGs) or other molecules that are significant in chemical amplification photoresist.

The photoresist layer is then developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Other developers may include 2-heptanone, n-butyl acetate, isoamyl acetate, cyclohexanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, or isobutyl propionate. Generally, any suitable developer may be used. Sometimes, a post develop bake or "hard bake" may be performed to stabilize the photoresist pattern after development, for optimum performance in subsequent steps.

Continuing, portions of the substrate below the first patterned photoresist layer are now exposed. In step 105, the substrate is etched, thus transferring the photoresist pattern to the substrate.

Generally, any etching step used herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform (CHF$_3$), difluoromethane (CH$_2$F$_2$), fluoromethane (CH$_3$F), trifluoromethane (CHF$_3$), carbon fluorides, nitrogen (N$_2$), hydrogen (H$_2$), oxygen (O$_2$), argon (Ar), xenon (Xe), xenon difluoride (XeF$_2$), helium (He), carbon monoxide (CO), carbon dioxide (CO$_2$), fluorine (F$_2$), chlorine (Cl$_2$), oxygen (O$_2$), hydrogen bromide (HBr), hydrofluoric acid (HF), nitrogen trifluoride (NF$_3$), sulfur hexafluoride (SF$_6$), boron trichloride (BCl$_3$), ammonia (NH$_3$), bromine (Br$_2$), nitrogen trifluoride (NF$_3$), or the like, or combinations thereof in various ratios. For example, silicon dioxide can be wet etched using hydrofluoric acid and ammonium fluoride. Alternatively, silicon dioxide can be dry etched using various mixtures of CHF$_3$, O$_2$, CF$_4$, and/or H$_2$.

Figure 3:
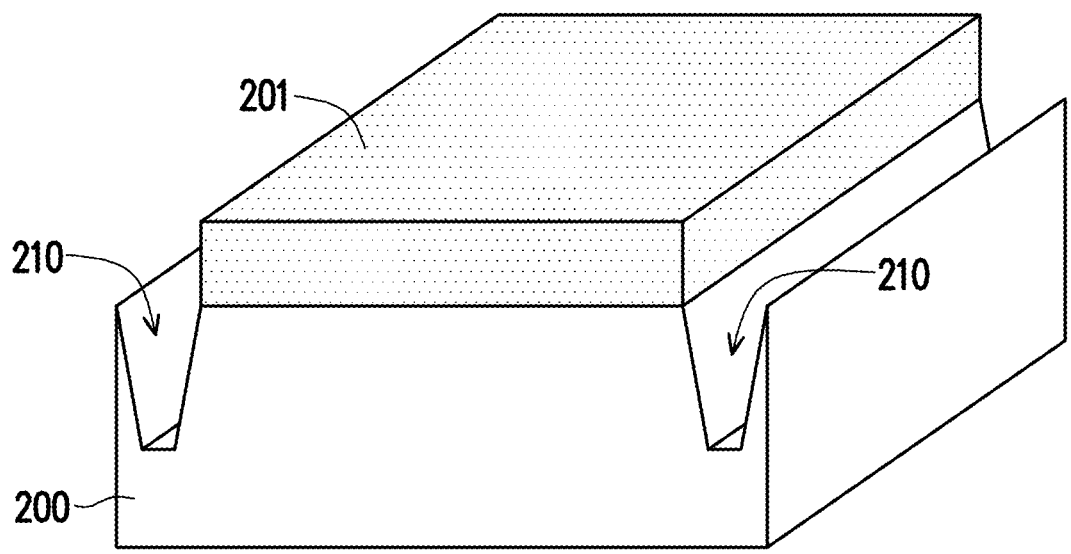
FIG. 3 is a perspective view of the substrate after a processing step.

FIG. 3 illustrates the result. As seen here, a pair of parallel trenches 210 has been formed in the substrate 200. These trenches extend along the Y-axis of the substrate. Not shown here, a second pair of parallel trenches which extend along the X-axis has also been etched into the substrate. The first patterned photoresist layer 201 is also visible between the trenches 210.

Referring back to FIG. 1, in step 110, the trenches extending along both the Y-axis and the X-axis are filled with a dielectric material to form isolation regions. The isolation regions may be, for example, shallow trench isolation (STI) regions or deep trench isolation (DTI) regions. The dielectric material in the STI region is commonly a silicon oxide, although other dielectric materials can also be used such as undoped polysilicon, silicon nitride, silicon oxynitride, fluoride-doped silicate glass, or other dielectric material. The deposition can be done using physical vapor deposition (PVD) or chemical vapor deposition (CVD) or spin-on processes known in the art, or can be grown via oxidation.

Then, in step 112, the first patterned photoresist layer is removed. This can be done, for example, using various solvents such as N-methyl-pyrrolidone (NMP) or alkaline media or other strippers at elevated temperatures, or by dry etching using oxygen plasma.

Figure 4A:
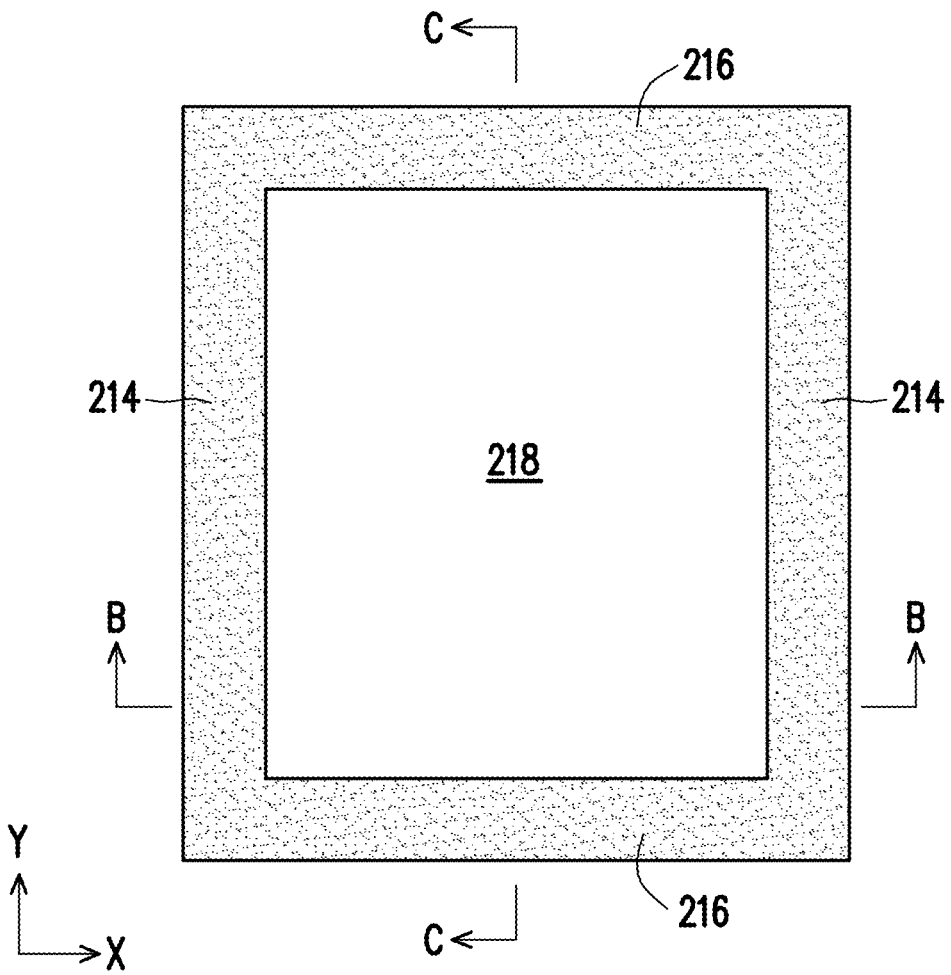
FIGS. 4A-4C are different views of the substrate after a processing step.
Figure 4B:
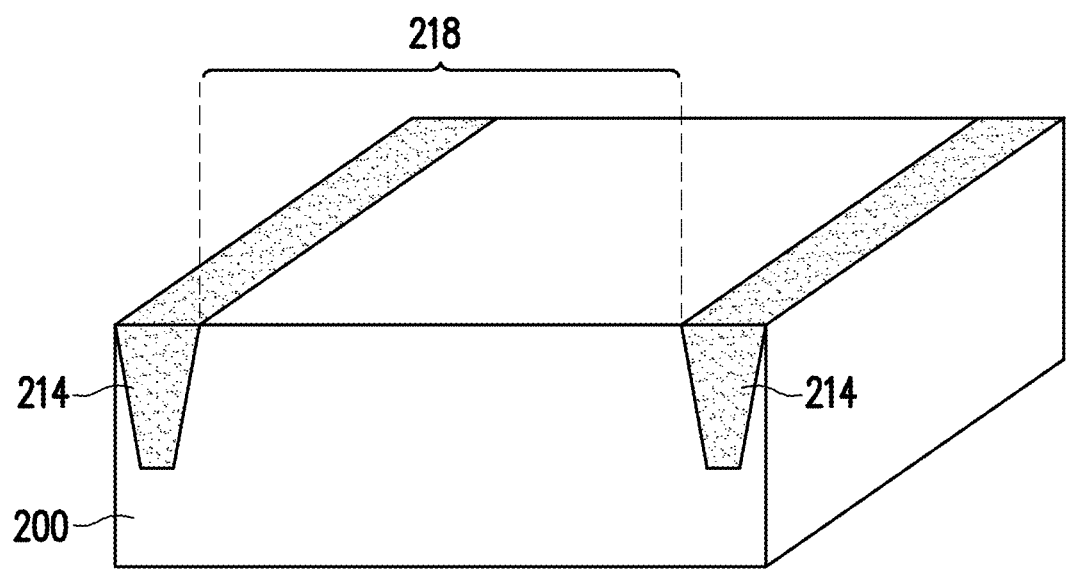
Figure 4C:
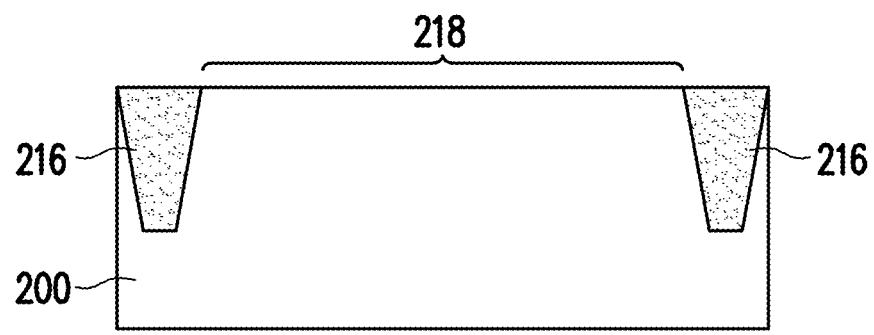

FIGS. 4A-4C show the result after the isolation regions are formed. FIG. 4A is a plan view showing the pair of isolation regions 214 extending along the Y-axis and the pair of isolation regions 216 extending along the X-axis. An active region 218 can be considered to be defined between each pair of isolation regions or by all four isolation regions. Alternatively, the isolation regions 214, 216 can together be considered as one isolation region since they are formed in the same step and are physically connected together. FIG. 4B is the view along the X-axis shown by line B-B of FIG. 4A. This figure shows the pair of isolation regions 214 extending along the Y-axis, with the active region 218 in between them. The isolation regions extending along the X-axis are not visible here. FIG. 4C is the view along the X-axis shown by line B-B of FIG. 4A. This figure shows the pair of isolation regions 216 extending along the X-axis, with the active region 218 in between them. The isolation regions extending along the Y-axis are not visible here. Subsequent perspective views will also be taken along line B-B of FIG. 4A, and subsequent cross-sectional views will also be taken along line C-C of FIG. 4A.

Figure 5:
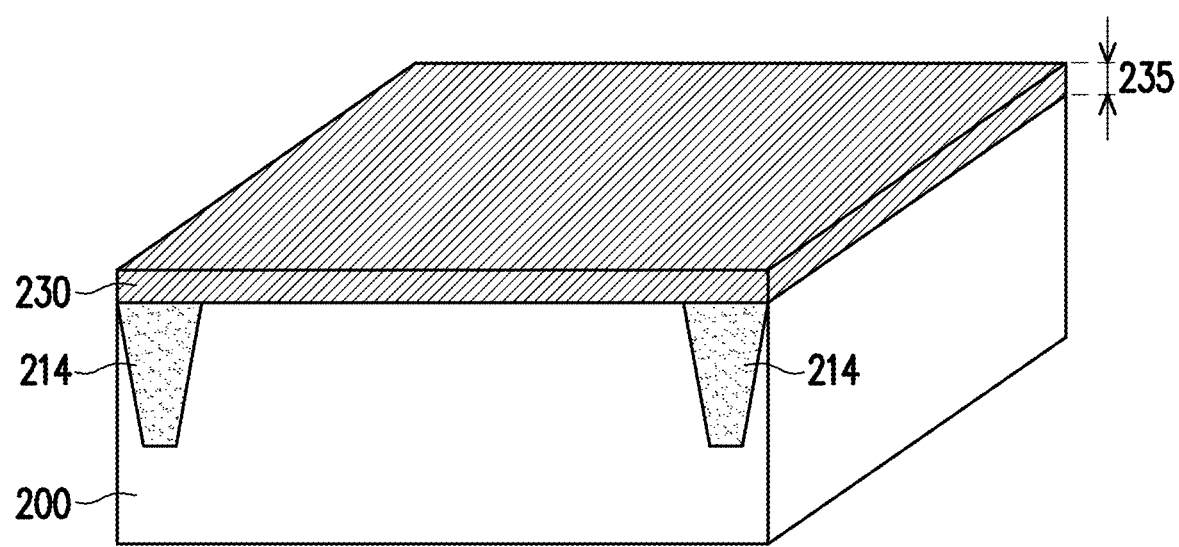
FIG. 5 is a perspective view of the substrate along the X-axis after a processing step.

Continuing, in step 120 of FIG. 1, a pad oxide layer 230 is formed over the active region 218. The oxide used to form the pad oxide layer can be, for example, a silicon oxide such as silicon dioxide (SiO$_2$), AlO$_x$, HfO$_x$, ZrO$_x$, or other suitable material. The pad oxide layer can be formed by thermal oxidation, PVD, CVD, ALD, oxidation, or other suitable deposition technique. In some non-limiting examples, the pad oxide layer 230 may have a thickness or depth 235 of from about 10 angstroms to about 30 angstroms. FIG. 5 shows the result after this step.

Figure 6:
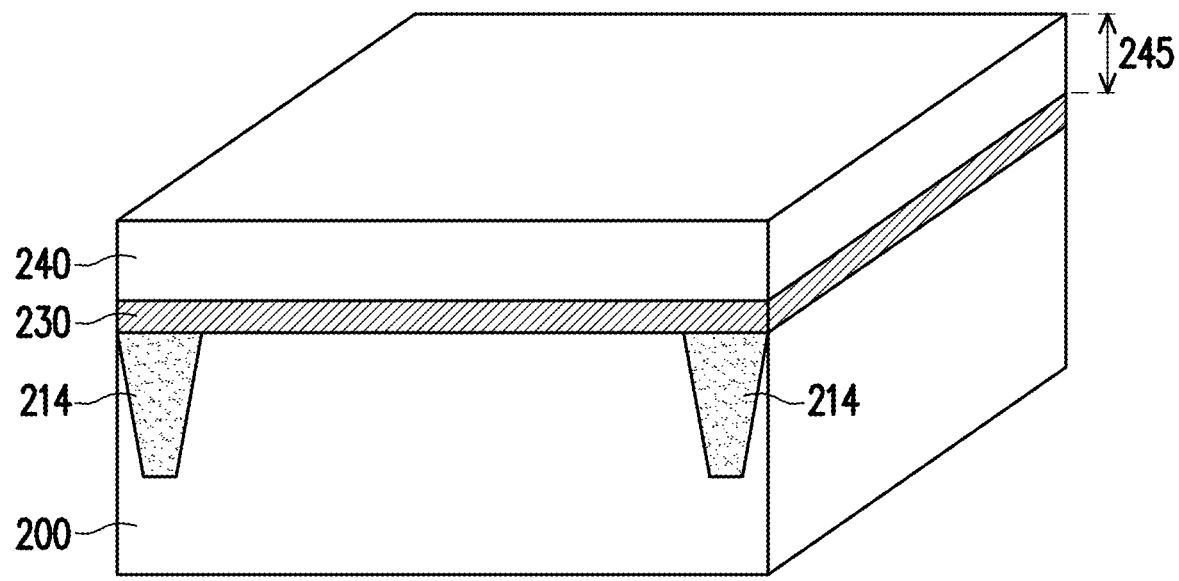
FIG. 6 is a perspective view of the substrate along the X-axis after a processing step.

Next, in step 125 of FIG. 1, a nitride layer 240 is deposited upon the pad oxide layer 230. The nitride used to form the nitride layer can be, for example, silicon nitride or silicon oxynitride. The nitride layer can be formed by PVD, CVD, ALD, oxidation, or other suitable deposition technique. In some particular embodiments, the nitride layer 240 may have a thickness or depth 245 of from about 100 angstroms to about 1000 angstroms. FIG. 6 shows the result after this step.

Figure 7:
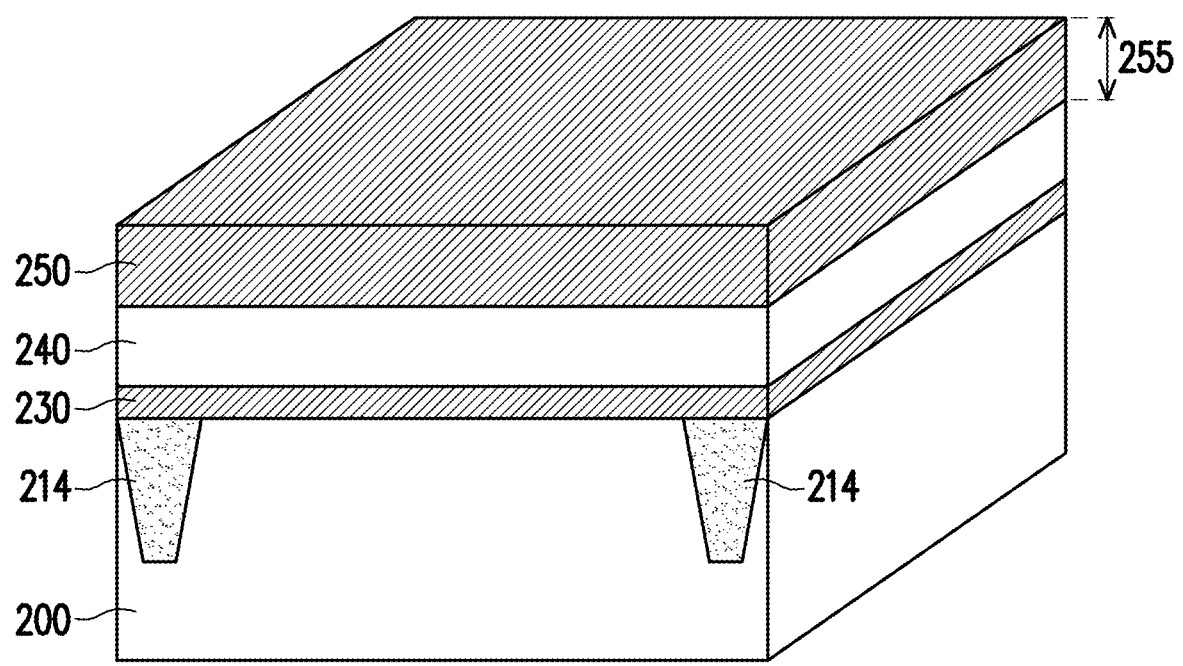
FIG. 7 is a perspective view of the substrate along the X-axis after a processing step.

Then, in step 130 of FIG. 1, a capping oxide layer 250 is deposited upon the nitride layer 240. The capping oxide layer can also be formed, for example, a silicon oxide such as silicon dioxide (SiO$_2$), AlO$_x$, HfO$_x$, ZrO$_x$, or other suitable material. Again, the capping oxide layer can be formed by thermal oxidation, PVD, CVD, ALD, oxidation, or other suitable deposition technique. In some particular embodiments, the capping oxide layer 250 may have a thickness or depth 255 of from about 100 angstroms to about 1000 angstroms. FIG. 7 shows the result after this step. Together, the pad oxide layer 230, the nitride layer 240, and the capping oxide layer 250 may reduce or prevent oxidation of the source/drain terminals, especially if the terminals are made of metal. They will also act as a hard mask for subsequent etching steps.

Figure 8A:
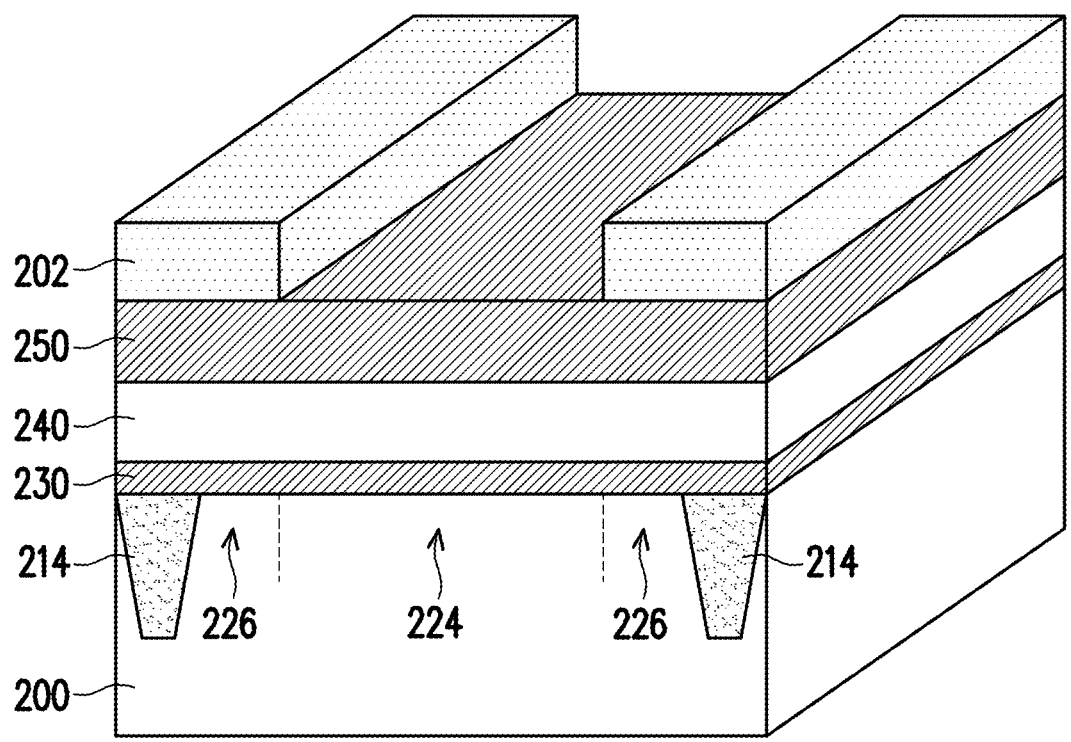
FIG. 8A and FIG. 8B are different views of the substrate after a processing step.
Figure 8B:
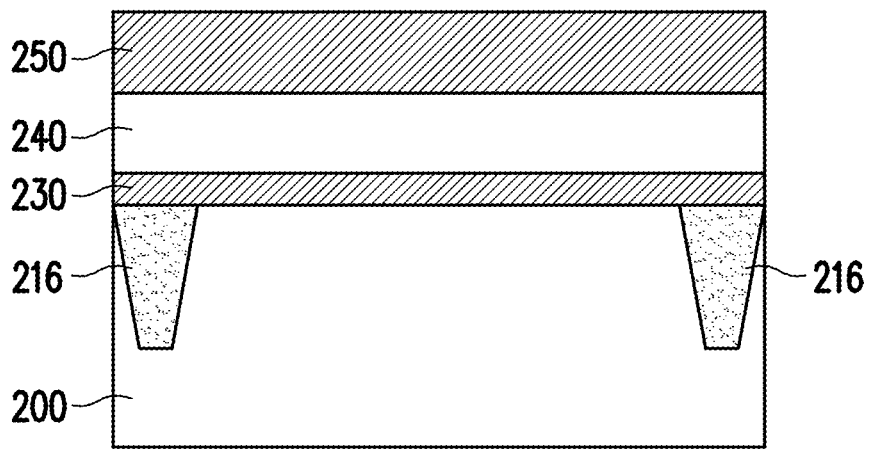

Next, in step 132 of FIG. 1, a second photoresist layer is deposited and patterned to obtain a second patterned photoresist layer. The result is illustrated in FIG. 8A and FIG. 8B. As seen in FIG. 8A, the second patterned PR layer 202 covers the isolation regions 214 and second portions 226 of the active region. As seen in both figures, a first portion 224 of the active region is exposed. The second portions 226 may also be considered source/drain regions, since they will eventually be doped to form source/drain terminals (as described further herein).

Afterwards, in step 135 of FIG. 1, etching is performed through the second patterned PR layer 202, the capping oxide layer 250, the nitride layer 240, the pad oxide layer 230, and down into the substrate 200 to form a longitudinal trench or recess 260. This etching is typically performed by dry etching. The result is illustrated in FIG. 9A and FIG. 9B.

Figure 9A:
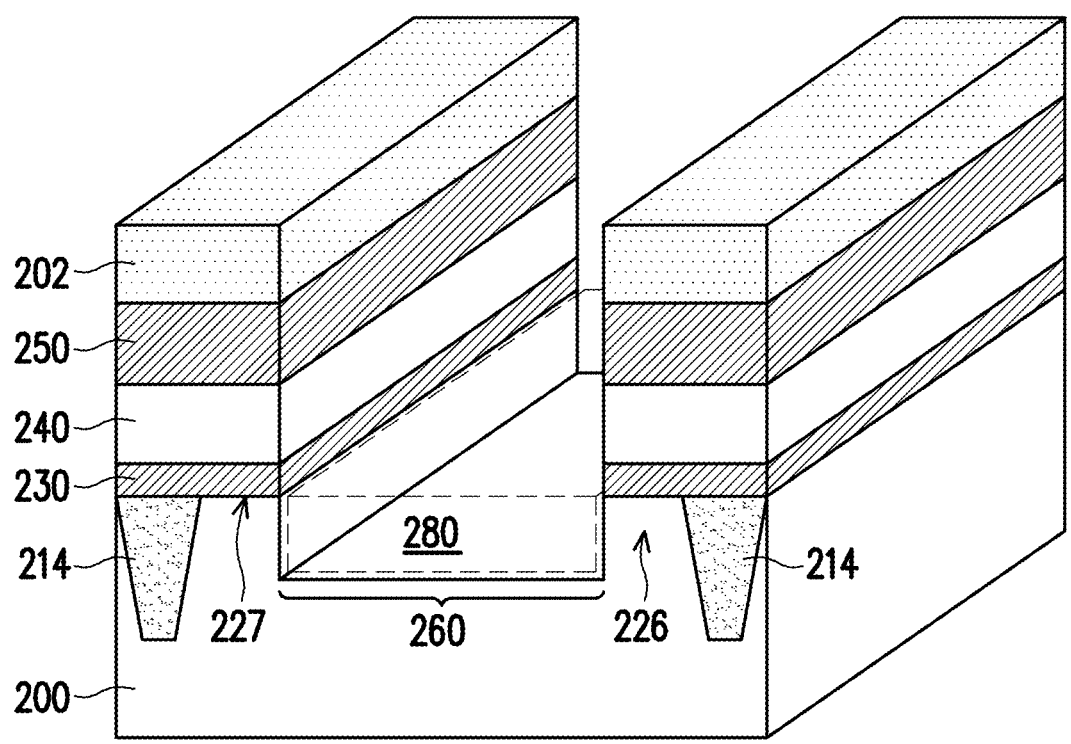
FIG. 9A and FIG. 9B are different views of the substrate after a processing step.

Referring to FIG. 9A, the longitudinal trench defines a gate region 280 within the first portion of the active region. The second portions 226 are located on opposite sides of the gate region 280.

The longitudinal trench 260 may also be considered a recessed first portion of the active region. Put another way, the top surface 227 of the second portion 226 is higher than the top surface 262 of the recessed first portion 224. Thus, step 135 could also be described as recessing the first portion of the active region.

Figure 9B:
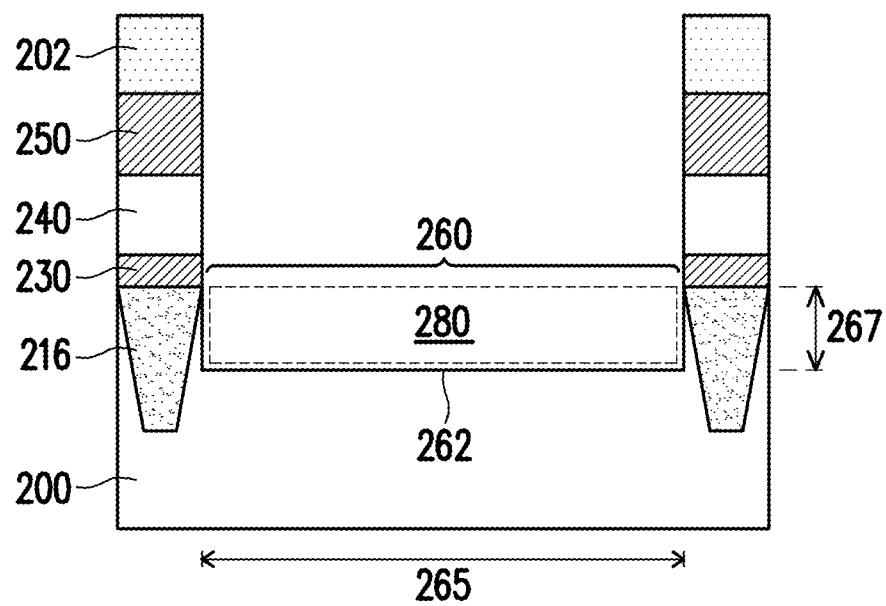

Referring to FIG. 9B, the longitudinal trench 260 has a width 265 and a depth 267. The top surface 262 of the recessed first portion 224 can also be referred to as a lower surface of the longitudinal trench. The top surface 262 may also be considered to be part of the substrate 200. The width of the longitudinal trench is measured parallel to the source/drain terminals which will eventually be located in the second portions 226, not between them. In particular embodiments, the longitudinal trench has a width of from about 0.5 micrometers (µm) to about 20 µm. In particular embodiments, the longitudinal trench has a depth of from about 0.1 µm to about 0.2 µm. Any desirable combination of width and depth may be used. It is noted that as illustrated here, the longitudinal trench 260 is located entirely between the isolation regions 216. It is contemplated that in other embodiments, the longitudinal trench 260 may extend into the isolation regions 216, or in other words portions of the isolation regions 216 (but not isolation regions 214) may be removed to form the longitudinal trench.

Figure 10A:
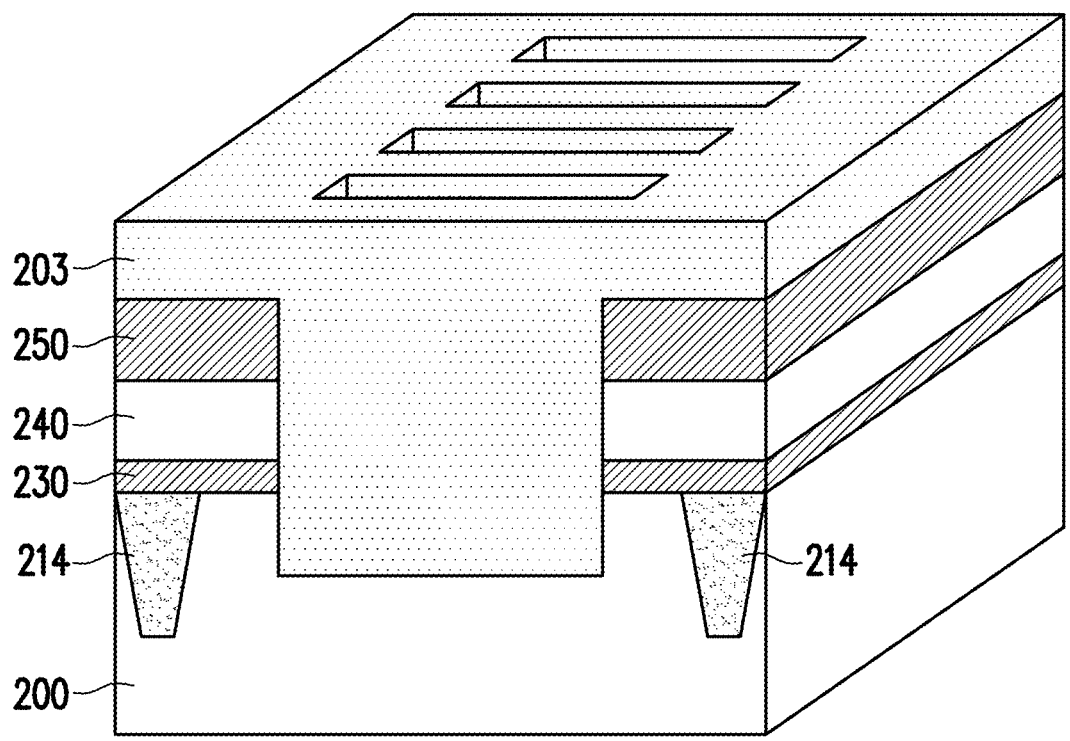
FIG. 10A and FIG. 10B are different views of the substrate after a processing step.
Figure 10B:
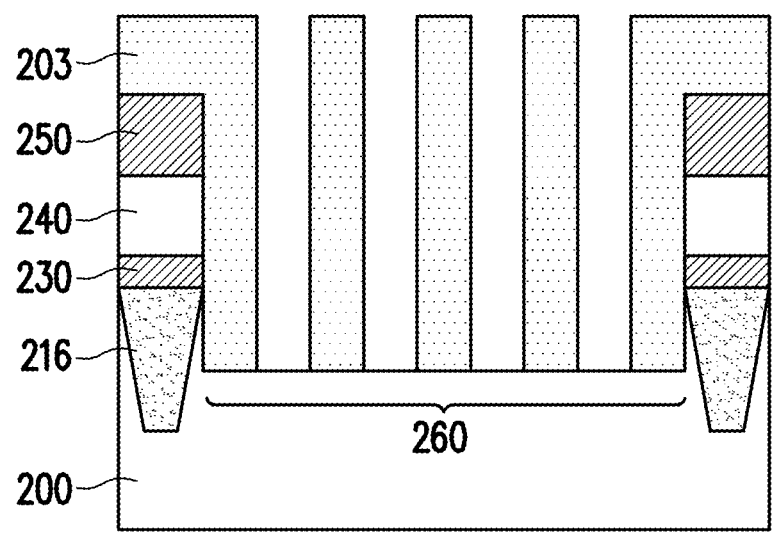

In step 136 of FIG. 1, the second patterned PR layer 202 is removed. Then, in step 138, a third photoresist layer is deposited and patterned to obtain a third patterned photoresist layer. The result is illustrated in FIG. 10A and FIG. 10B. As seen in FIG. 10A, the third patterned PR layer 203 also covers the isolation regions 214 and the second portions 226. As seen in both figures, portions of the longitudinal trench 260 are exposed.

Continuing, in step 140 of FIG. 1, etching is performed through the third patterned PR layer 203 and further down into the substrate 200 to form a plurality of lateral trenches or recesses 270. This etching may also be described as etching into the longitudinal trench, or etching into the lower surface 262 of the longitudinal trench 260. The lateral trenches or recesses 270 can also be described as being below the longitudinal trench 260. This etching step is typically performed by dry etching. The result is illustrated in FIGS. 11A-11C.

Figure 11A:
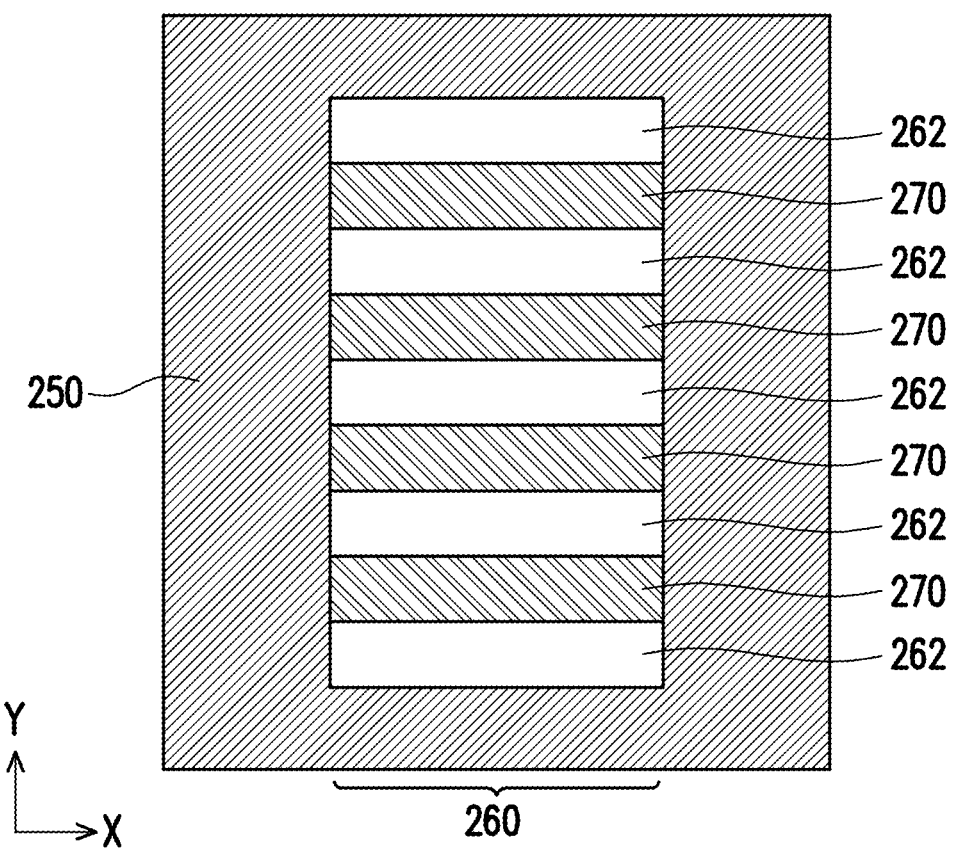
FIGS. 11A-11C are different views of the substrate after a processing step.

In the plan view of FIG. 11A, the etched capping oxide layer 250 is visible. The bottom surfaces of the lateral trenches 270 are indicated with dashed line, while the lower surface 262 of the longitudinal trench 260 is indicated as a solid white surface.

Figure 11B:
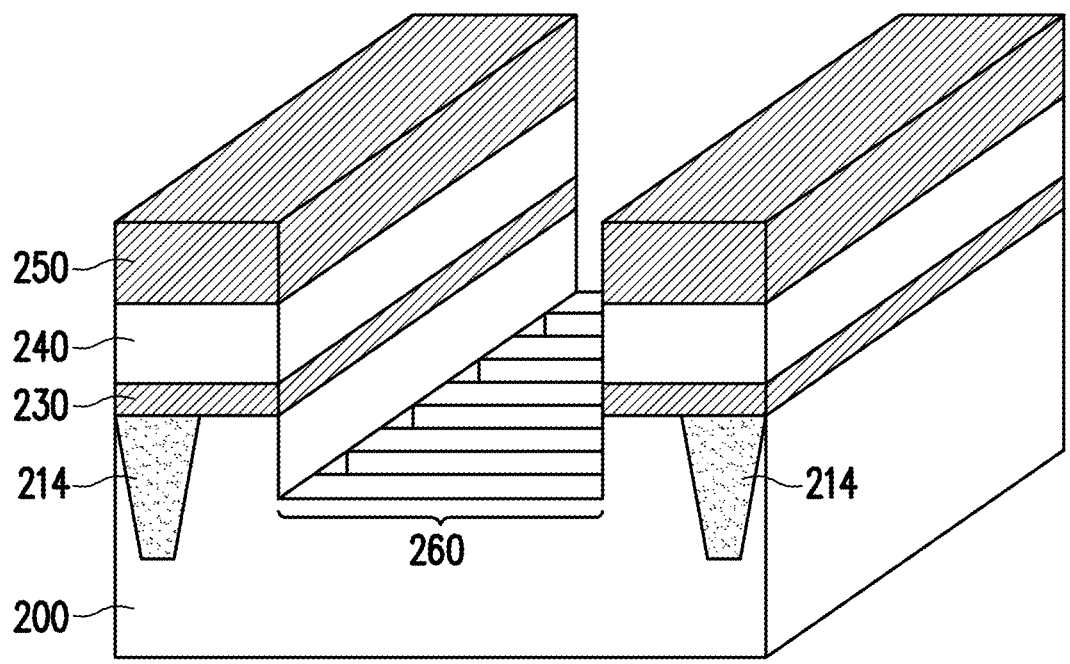

As best seen in FIG. 11B, the lateral trenches 270 run in the direction between the source/drain terminals 222, or along the X-axis.

Figure 11C:
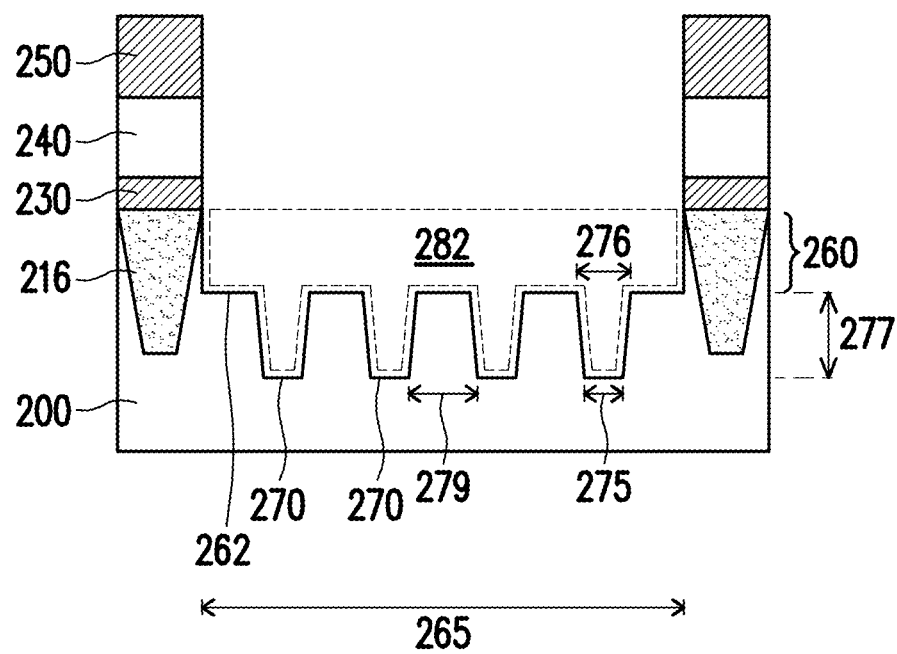

Referring to FIG. 11C, together, the longitudinal trench 260 and the lateral trenches 270 form a dual-recess structure that is also referred to as a gate volume 282. Each lateral trench has a bottom width 275, a top width 276, and a depth 277. The width of the lateral trenches is measured parallel to the source/drain terminals, not between them. In particular embodiments, each lateral trench has a bottom width of from about 0.02 μm to about 0.5 μm. In particular embodiments, each lateral trench has a top width of from about 0.02 μm to about 0.5 μm. In particular embodiments, each lateral trench has a depth of from about 0.05 μm to about 0.1 μm. Any desirable combination of width and depth may be used. Generally, the lateral trenches all have the same dimensions.

The bottom width 275 of each lateral trench is illustrated here at the bottom of each lateral trench. In FIG. 11C, the lateral trenches are illustrated as having a tapered shape, where they are tapered downwards, i.e. the bottom width 275 is less than the top width 276.

The distance between adjacent lateral trenches is indicated as width 279 at the lower surface 262 of the longitudinal trench 260. In particular embodiments, this width separating adjacent lateral trenches is also from about 0.02 μm to about 0.5 μm.

Four lateral trenches are shown in FIG. 11C. However, the total number of lateral trenches 270 may vary depending on the width 265 of the longitudinal trench 260, the bottom width 275 and top width 276 of each lateral trench, and the width 279 between adjacent lateral trenches. In some embodiments, the total number of lateral trenches may range from about 12 to about 16 per 10 μm width of the longitudinal trench. It is noted that the longitudinal trench and lateral trenches are depicted here as being trapezoidal, i.e. tapered downwards, but their actual physical shape may differ. For example, they may be rectangular.

Figure 12:
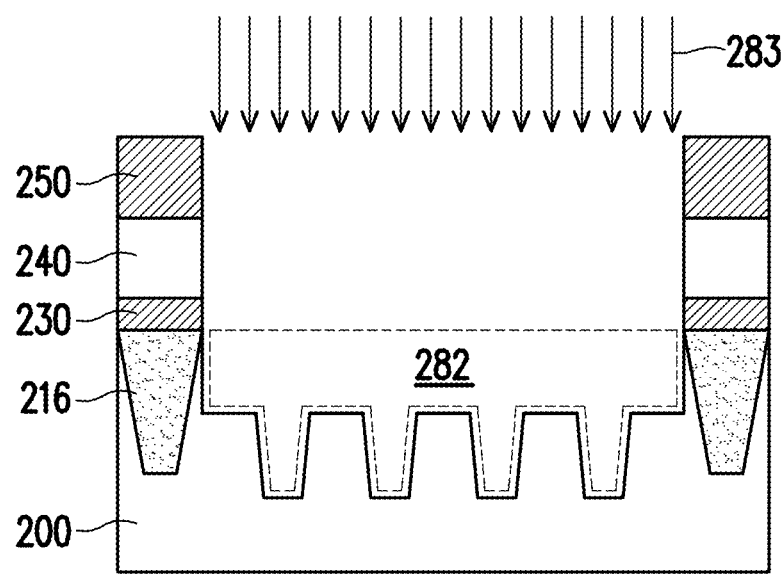
FIG. 12 is a cross-sectional view along the Y-axis of the substrate illustrating a processing step.

In step 142 of FIG. 1, the third patterned PR layer 203 is removed. In optional step 143, ions may be implanted below the gate volume. This may be performed to change various properties of the substrate as desired, for example to obtain a double diffusion drain metal oxide semiconductor (DDD-MOS) or a lateral diffusion MOS (LDMOS). Either p-type ions or n-type ions may be implanted. FIG. 12 illustrates this ion implantation, with the ions being shown as arrows 283. Here, the combination of the capping oxide layer 250, the nitride layer 240, and the pad oxide layer 230 acts as a hard mask for the regions of the substrate that they cover.

Next, in step 145 of FIG. 1, a gate oxide layer 290 is formed in the gate volume 282/recesses or trenches 260, 270. This can be done using thermal oxidation, ALD, or other deposition processes. The gate oxide layer can be formed from silicon dioxide ($SiO_2$), or more desirably from a high-k dielectric material. In embodiments, the high-k dielectric material has a dielectric constant higher than 5, or higher than 7, or higher than 10. Examples of suitable high-k dielectric materials include hafnium dioxide ($HfO_2$), zirconium dioxide ($ZrO_2$), aluminum oxide ($Al_2O_3$), hafnium oxynitride ($HfO_xN_y$) or zirconium oxynitride ($ZrO_xN_y$), or hafnium silicates ($ZrSi_xO_y$) or zirconium silicates ($ZrSi_xO_y$).

Figure 13A:
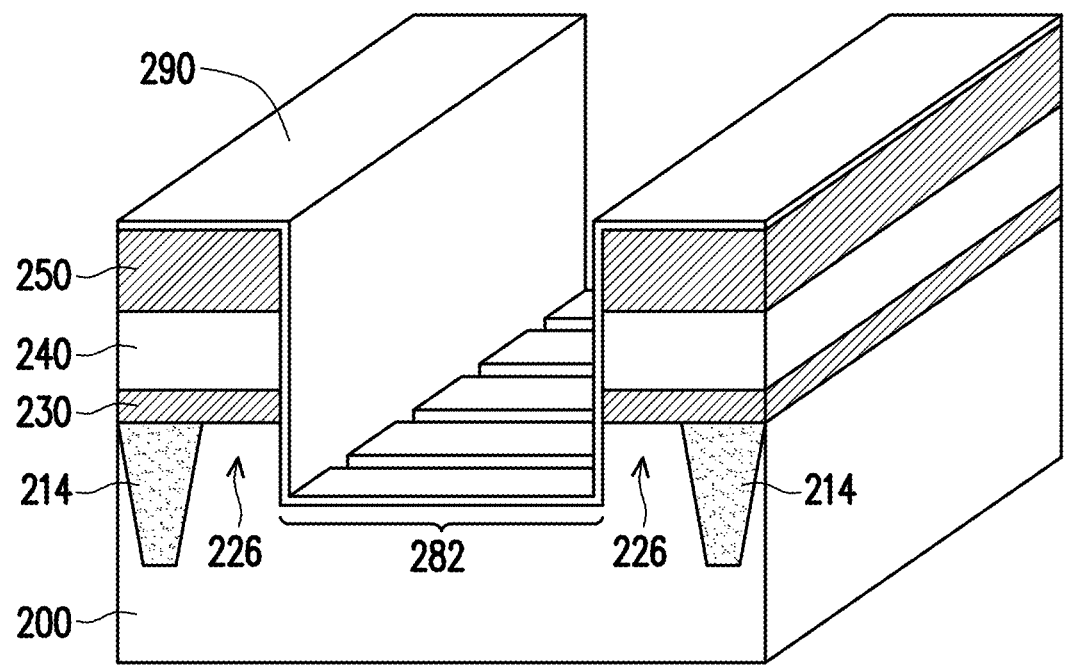
FIG. 13A and FIG. 13B are different views of the substrate after a processing step.
Figure 13B:
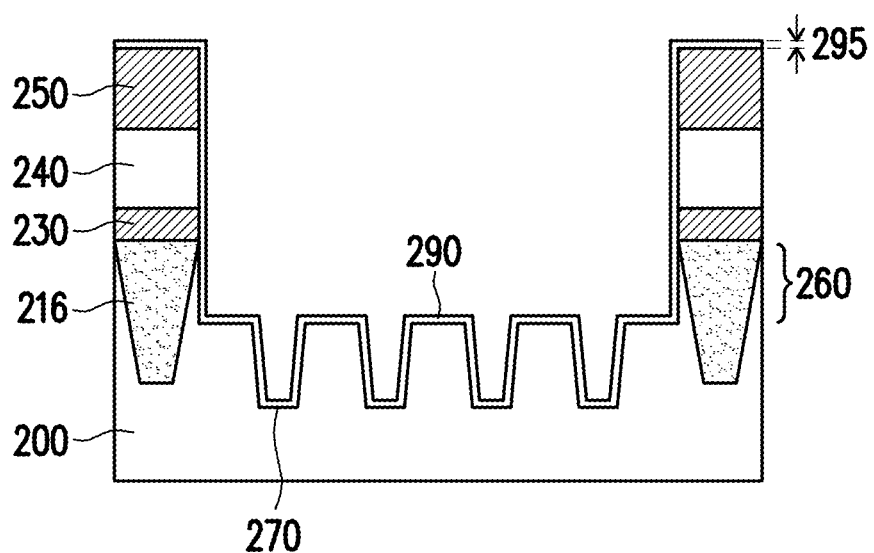

The resulting structure is shown in FIG. 13A and FIG. 13B. As seen in these two figures, the gate oxide layer 290 covers the horizontal surfaces and the vertical surfaces of the gate volume. The gate oxide material may also be present on the exposed horizontal surfaces and vertical surfaces of the second portions 226, the pad oxide layer 230, the nitride layer 240, and the capping oxide layer 250 too. The gate oxide layer 290 may have a thickness or depth 295 of from about 100 angstroms to about 200 angstroms.

Next, in step 150 of FIG. 1, a gate material is deposited into the dual-recess structure of the longitudinal trench and the plurality of lateral trenches, such that the gate volume 282 is filled to form a gate structure or gate terminal 284. The gate material may be any suitable material, for example polysilicon or an electrically conductive metal or other electrically conductive material. In particular embodiments, the gate material is polysilicon. This layer may be formed using processes such as thermal oxidation, atomic layer deposition (ALD) or chemical vapor deposition (CVD), including plasma-enhanced atomic layer deposition (PEALD) or plasma-enhanced chemical vapor deposition (PECVD). The dual-recess structure increases the surface area of the gate terminal, which permits additional charge carriers and increases the saturation drain current of the transistor.

Figure 14A:
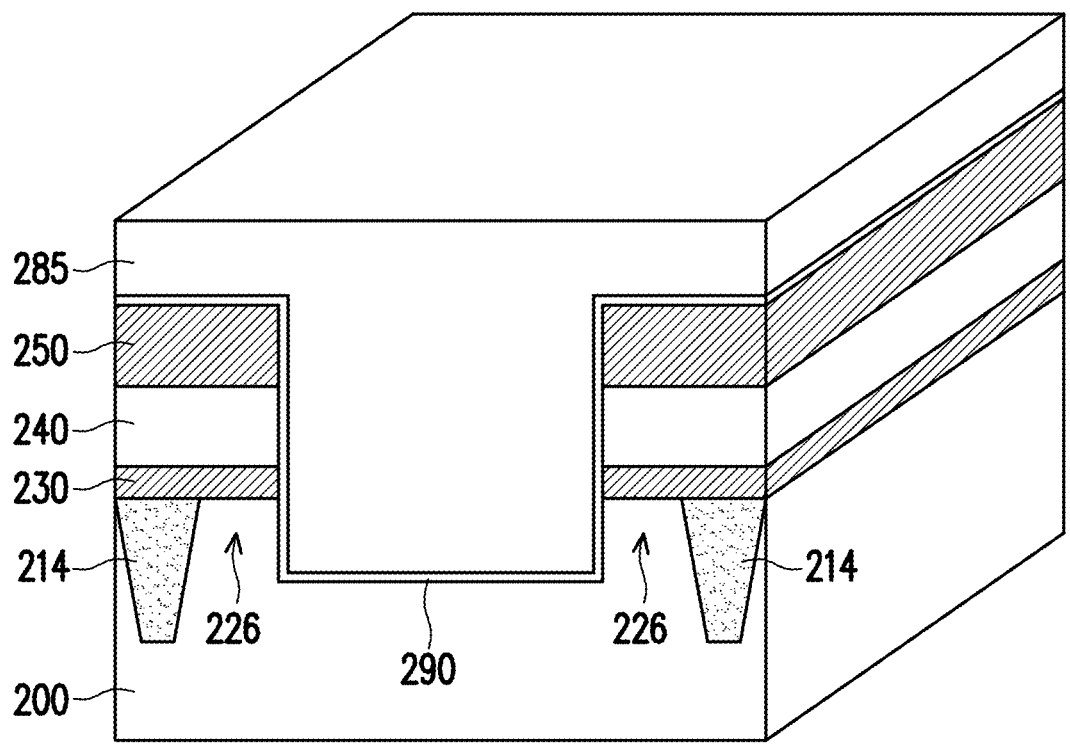
FIG. 14A and FIG. 14B are different views of the substrate after a processing step.
Figure 14B:
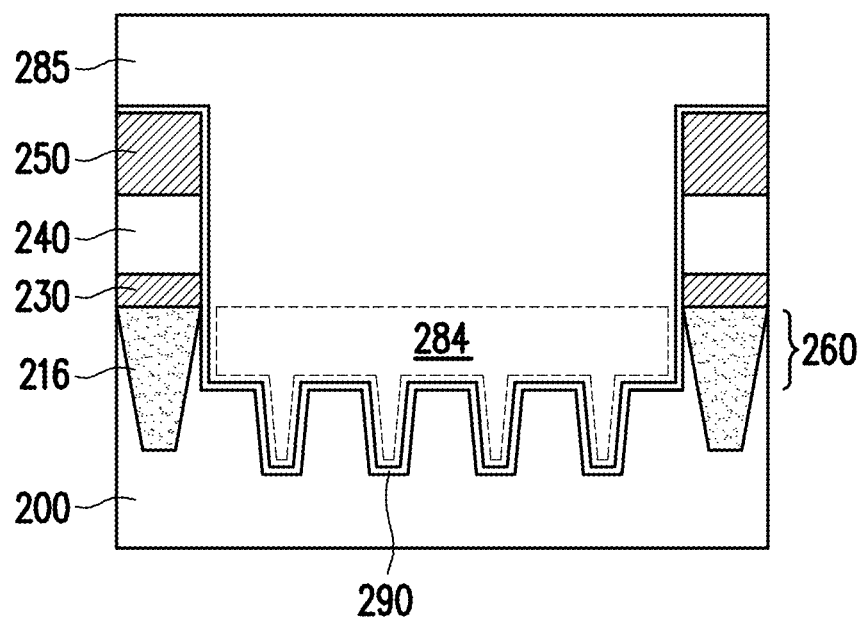

The resulting structure is shown in FIG. 14A and FIG. 14B. As seen in these two figures, the gate material fills the entire gate volume 282 as well as the volume etched out of the pad oxide layer 230, the nitride layer 240, and the capping oxide layer 250. In addition, as illustrated here, the gate material may form an additional layer upon the capping oxide layer. Excess gate material is indicated with reference numeral 285.

Continuing, in step 155 of FIG. 1, the substrate is planarized to expose the gate terminal 284. This also exposes the second portions 226 of the active region. Generally, the additional gate material, the capping oxide layer 250, the nitride layer 240, and the pad oxide layer 230 are removed. The planarizing may be performed, for example, using a chemical mechanical polishing (CMP) process.

Generally, CMP is performed using a rotating platen to which a polishing pad is attached. The substrate is attached to a rotating carrier. A slurry or solution containing various chemicals and abrasives is dispensed onto the polishing pad or the wafer substrate. During polishing, both the polishing pad and the carrier rotate, and this induces mechanical and chemical effects on the surface of the wafer substrate, removing undesired materials and creating a highly level surface on the wafer. A post-CMP cleaning step is then carried out using rotating scrubber brushes along with a washing fluid to clean one or both sides of the wafer substrate.

Figure 15:
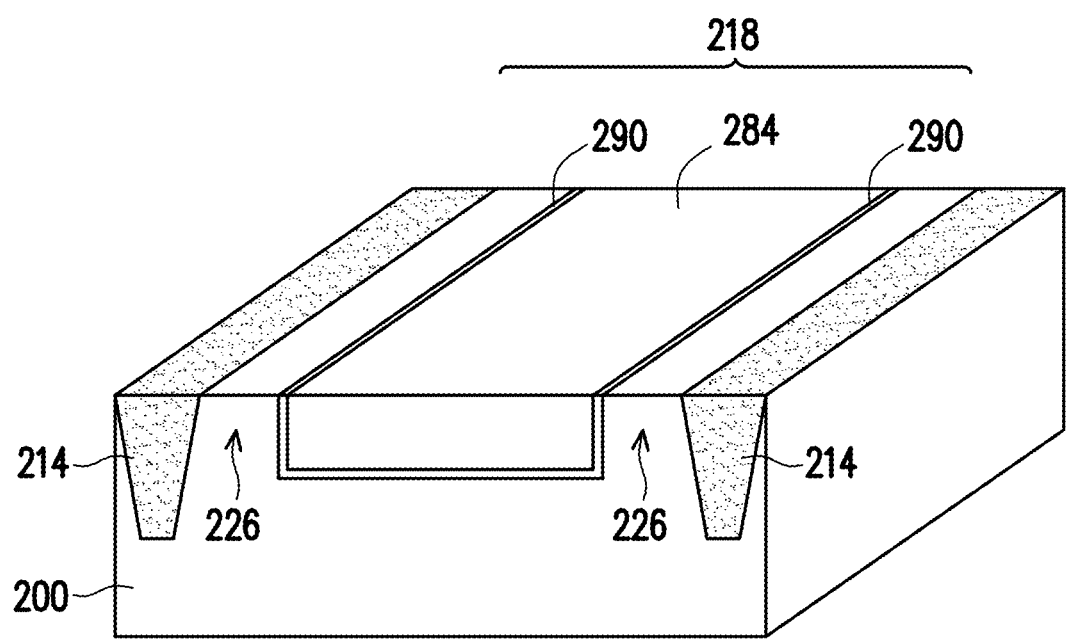
FIG. 15 is a perspective view of the substrate after a processing step.

The resulting structure is shown in FIG. 15. As seen here, the second portions 226 of the active region 218 on either side of the gate terminal 284 are now exposed, with the gate oxide layer 290 separating them from the gate terminal.

Continuing, in step 157 of FIG. 1, source/drain terminals 222 are formed in the second portions 226 of the active region. In particular embodiments, these terminals are formed via ion implantation. Briefly, an ion implanter is used to implant atoms into a silicon crystal lattice, modifying the conductivity of the lattice in the implanted location. An ion implanter generally includes an ion source, a beam line, and a process chamber. The ion source produces the desired ions (here, for example, Co, Ti, Ni, Pt, or Pb). The beam line organizes the ions into a beam having high purity in terms of ion mass, energy, and species. The ion beam is then used to irradiate the semiconducting wafer substrate in a process chamber. The ion beam strikes the exposed regions on the wafer substrate, and the ions can be implanted into the substrate as dopants at desired depths. Alternatively, the substrate can be partially etched, followed by blanket deposition of a metal, following by annealing in which the metal reacts with the underlying exposed silicon. Unreacted metal can then be removed, for example with a selective etch process. The gate terminal 284 is used as a mask for the doping of the exposed substrate at the specified locations.

Figure 16A:
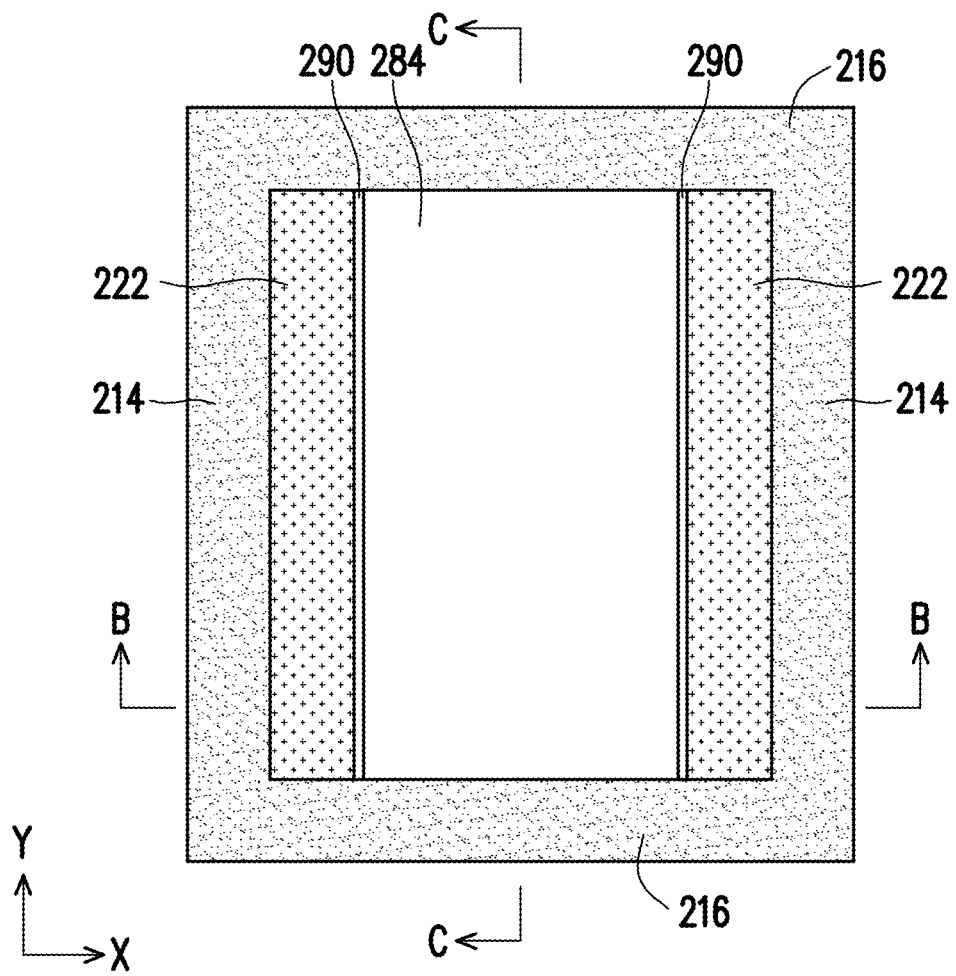
FIGS. 16A-16D are different views of the substrate after a processing step.
Figure 16B:
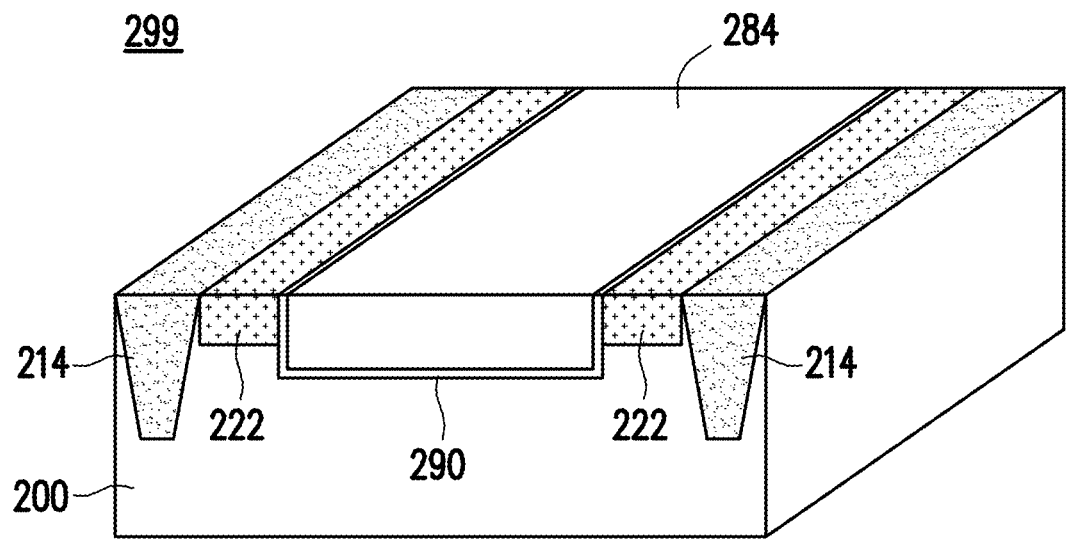
Figure 16C:
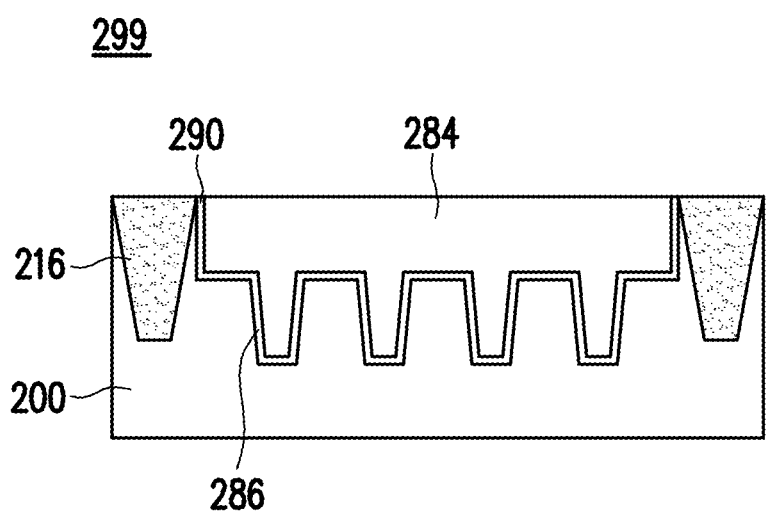
Figure 16D:
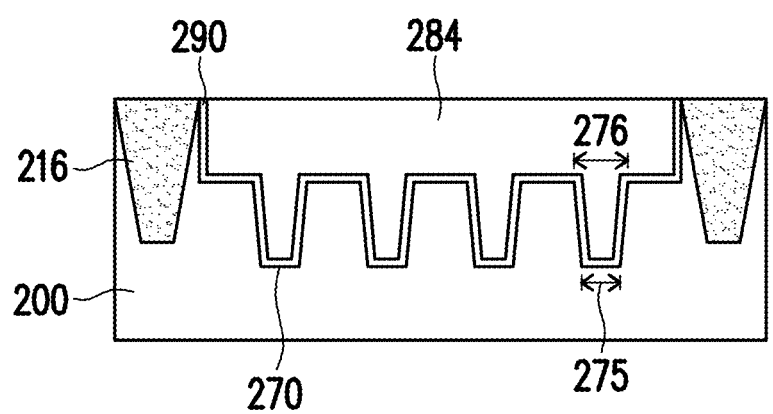

The resulting transistor structure 299 is shown in FIGS. 16A-16C. In FIG. 16A, lines B-B and C-C correspond to those shown in FIG. 4A. Here, the source/drain terminals 222 are located parallel to the isolation regions 214. As best seen here, the gate terminal 284 extends in the direction of the Y-axis, which is orthogonal to the X-axis, which runs in the direction of the channel between the source/drain terminals 222. In FIG. 16A and FIG. 16B, the source/drain terminals 222 and the isolation regions 214 run along (i.e. in the direction of) the Y-axis. In FIG. 16C, the isolation regions 216 run along the X-axis.

As seen in these three figures, the source/drain terminals 222 and the gate terminal 284 are now exposed, with the gate oxide layer 290 separating them. In the cross-sectional view of FIG. 16C, the bottom surface 286 of the gate terminal 284 can be described as wrinkled or crenellated. This shape is due to the combination of the longitudinal trench and the lateral trenches.

As illustrated here, the source/drain terminals 222 are formed after the gate terminal 284 is formed. However, if desired, the source/drain terminals 222 could be formed before the gate terminal 284 is formed. For example, they could be formed after the isolation regions are formed in step 112 that is illustrated in FIGS. 4A-4C. In such an embodiment, a patterned photoresist layer could be developed that covers the first portion 224 of the active region and the isolation regions 214. The second portions 226 of the active region, i.e. undoped source/drain regions 220 would be exposed. Ion implantation could then be performed to form the source/drain terminals 222. The photoresist layer could then be removed. These potential steps are identified with reference numeral 115.

As previously mentioned, the lateral trenches could be of any suitable shape. An alternative illustration is provided in FIG. 16D, which is a view of another embodiment along line C-C of FIG. 16A. Here, the lateral trenches 270 are illustrated as being tapered downwards, with their bottom width 275 being less than their top width 276.

Figure 17A:
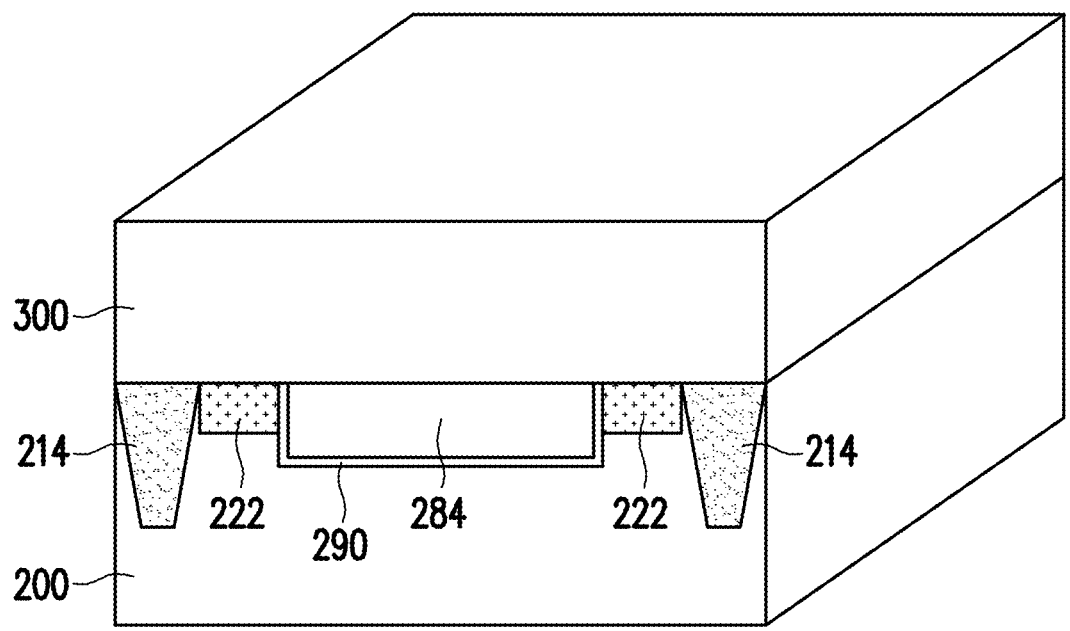
FIG. 17A and FIG. 17B are different views of the substrate after a processing step.
Figure 17B:
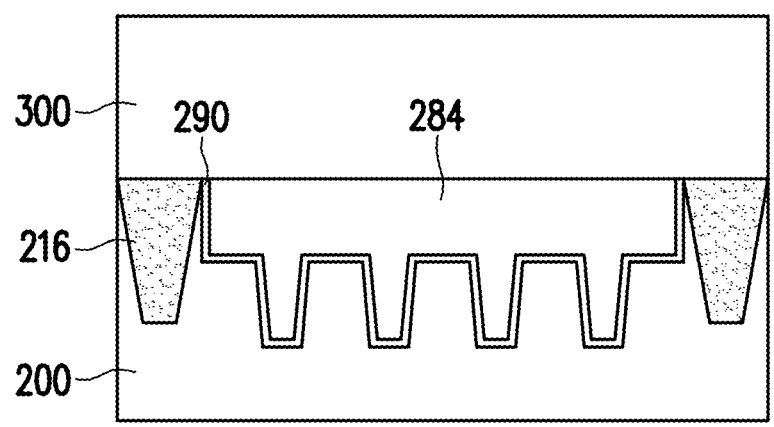

Continuing, then, electrical contacts may be formed. This process begins at step 160 of FIG. 1, where a first insulating layer 300 is formed over the active region 218 that includes the source/drain terminals 222 and the gate terminal 284. This layer may be formed using processes such as PVD, CVD, SACVD, or other suitable deposition process. The material for the first insulating layer may be silicon or other suitable dielectric material (e.g. silicon dioxide). The resulting structure is shown in FIG. 17A and FIG. 17B.

Figure 18A:
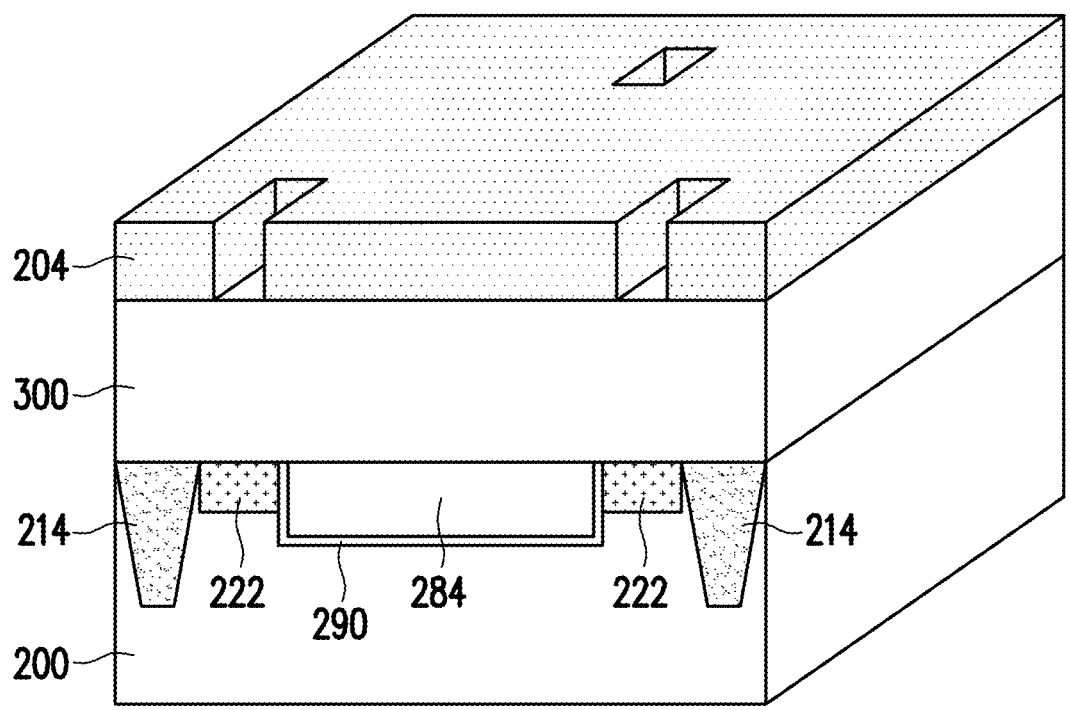
FIG. 18A and FIG. 18B are different views of the substrate after a processing step.
Figure 18B:
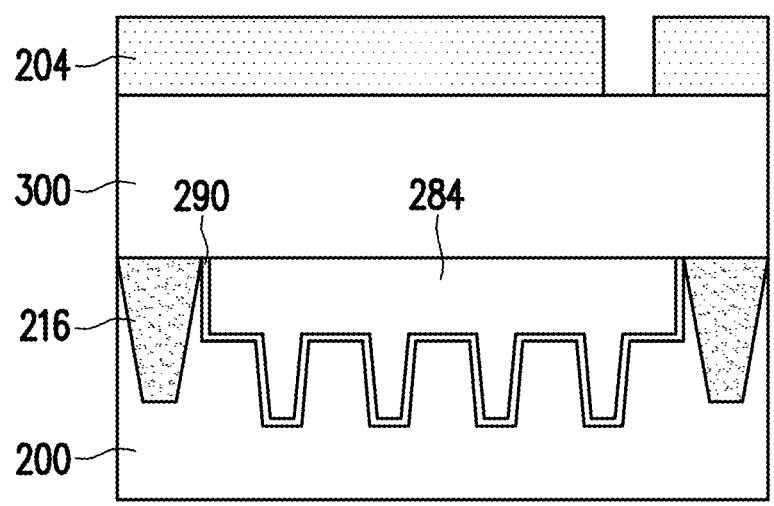

Then, in step 162 of FIG. 1, a fourth photoresist layer is deposited and patterned to obtain a fourth patterned photoresist layer. The resulting structure is illustrated in FIG. 18A and FIG. 18B. As seen in these two figures, the fourth patterned PR layer 204 exposes portions of the first insulating layer 300 located above the source/drain terminals 222 and the gate terminal 284.

Continuing, in step 165 of FIG. 1, etching is performed through the fourth patterned PR layer 204 to form vias 302, 304 that extend through the first insulating layer 300 to the source/drain terminals 222 and the gate terminal 284. In step 170, the vias are then filled with an electrically conductive material. In step 172, the fourth patterned PR layer is removed.

Figure 19A:
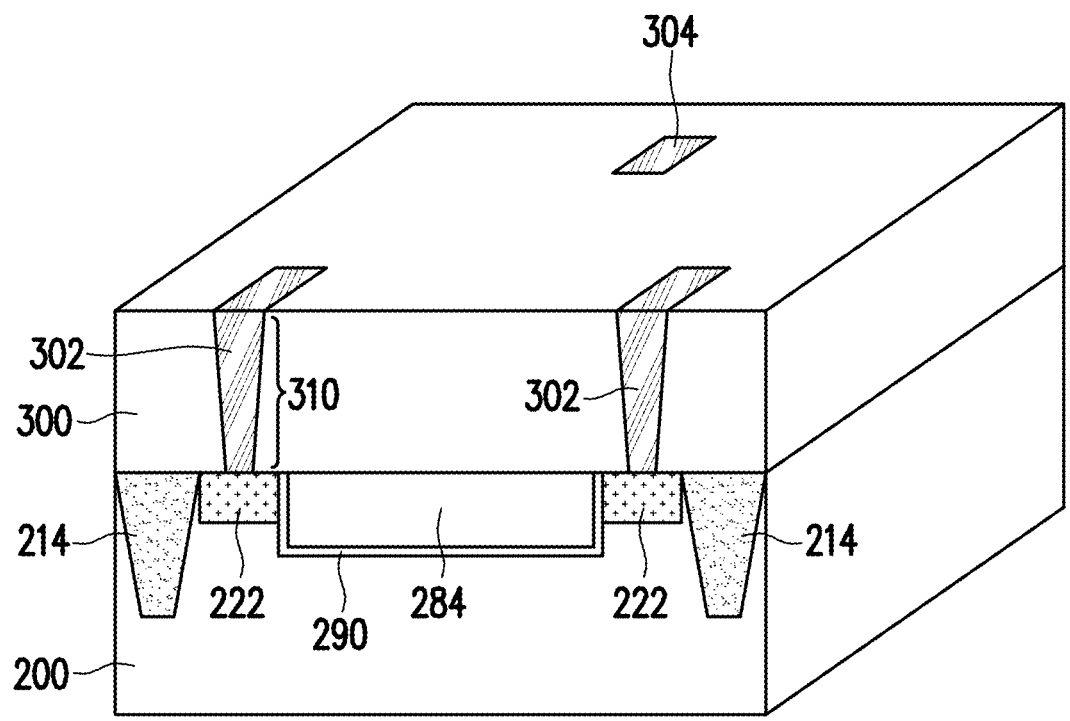
FIG. 19A and FIG. 19B are different views of the substrate after a processing step.
Figure 19B:
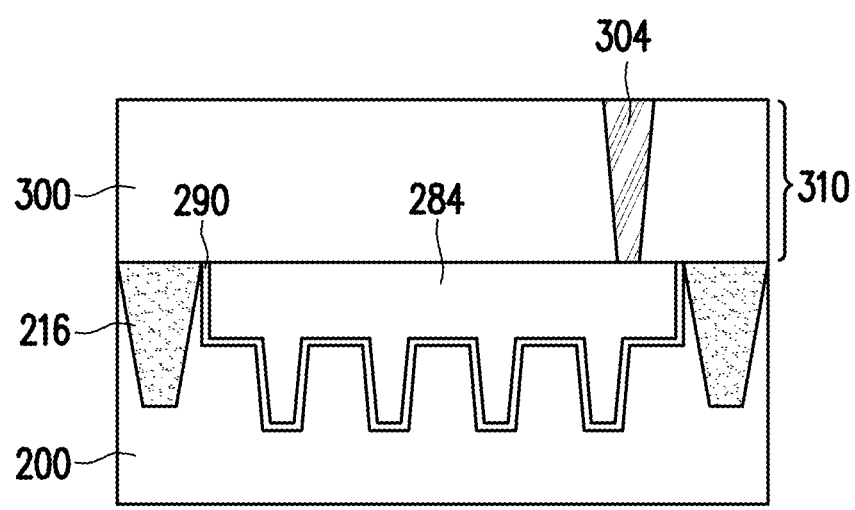

The resulting structure is illustrated in FIG. 19A and FIG. 19B. It is noted that the vias 302 for the source/drain terminals are separated in the direction of the Y-axis from the via 304 for the gate terminal.

The vias 302, 304 themselves may be sufficient to act as an electrical contact 310 (i.e. a source contact, a drain contact, and a gate contact) for further processing steps. If a larger contact footprint is desired, these steps can be repeated.

Figure 20A:
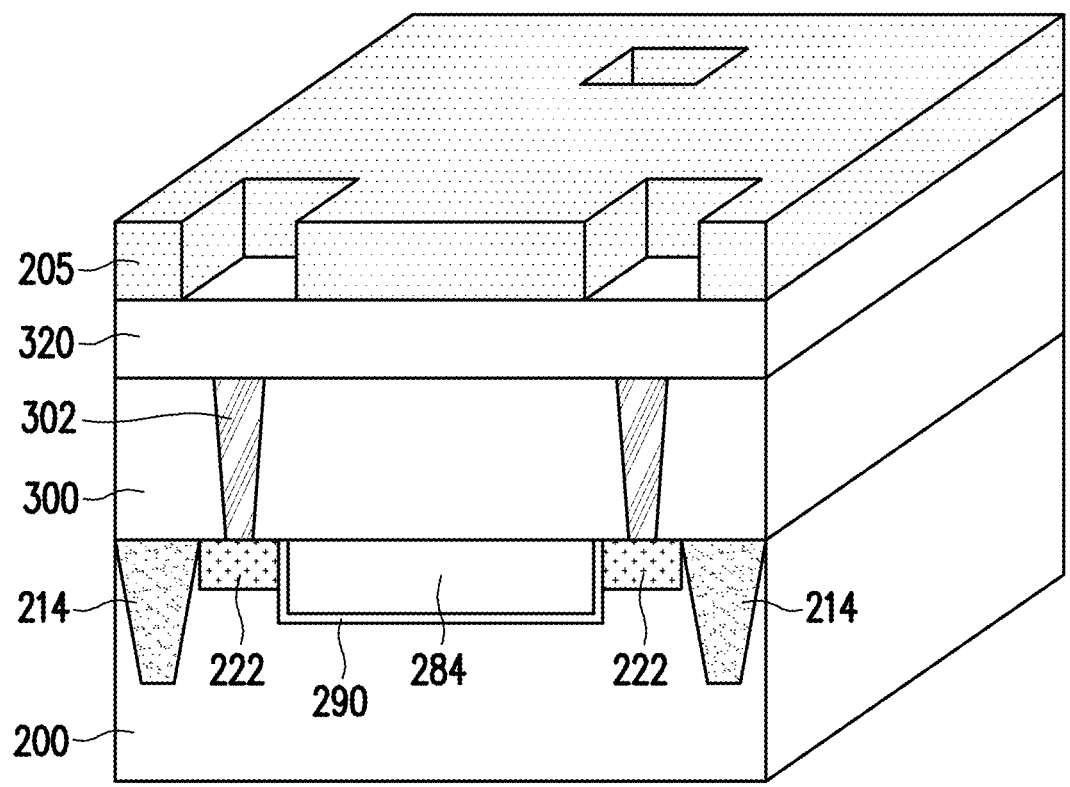
FIG. 20A and FIG. 20B are different views of the substrate after a processing step.
Figure 20B:
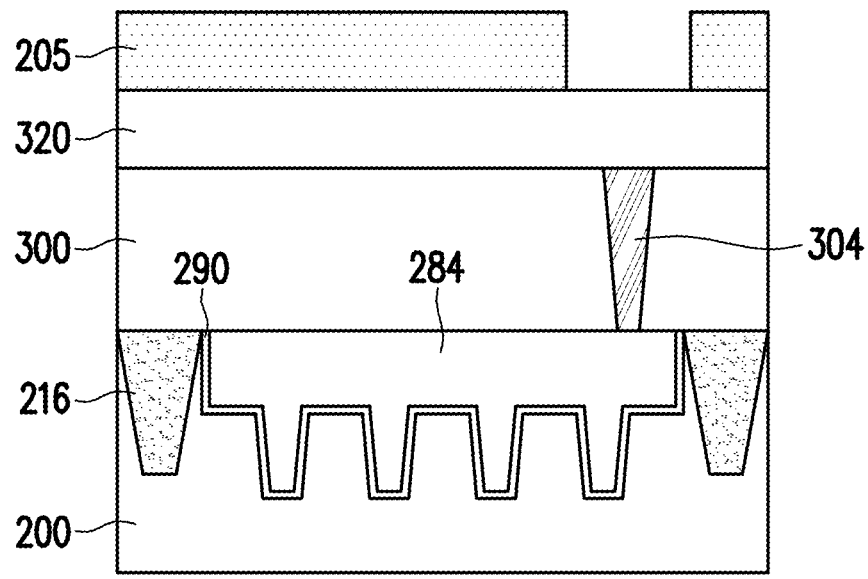

For example, in step 175 of FIG. 1, a second insulating layer 320 is formed over the active region 218. Then, in step 178, a fifth photoresist layer is deposited and patterned to obtain a fifth patterned photoresist layer. The resulting structure is illustrated in FIG. 20A and FIG. 20B. As seen in these two figures, the fifth patterned PR layer 205 exposes portions of the second insulating layer 320 located above the vias 302, 304 in the first insulating layer.

Continuing, in step 180 of FIG. 1, etching is performed through the fifth patterned PR layer 205 to form pads that extend through the second insulating layer 320 and above the vias 302, 304 in the first insulating layer 300. In step 185, the pads are then filled with an electrically conductive material. In step 188, the fifth patterned PR layer is removed.

Figure 21A:
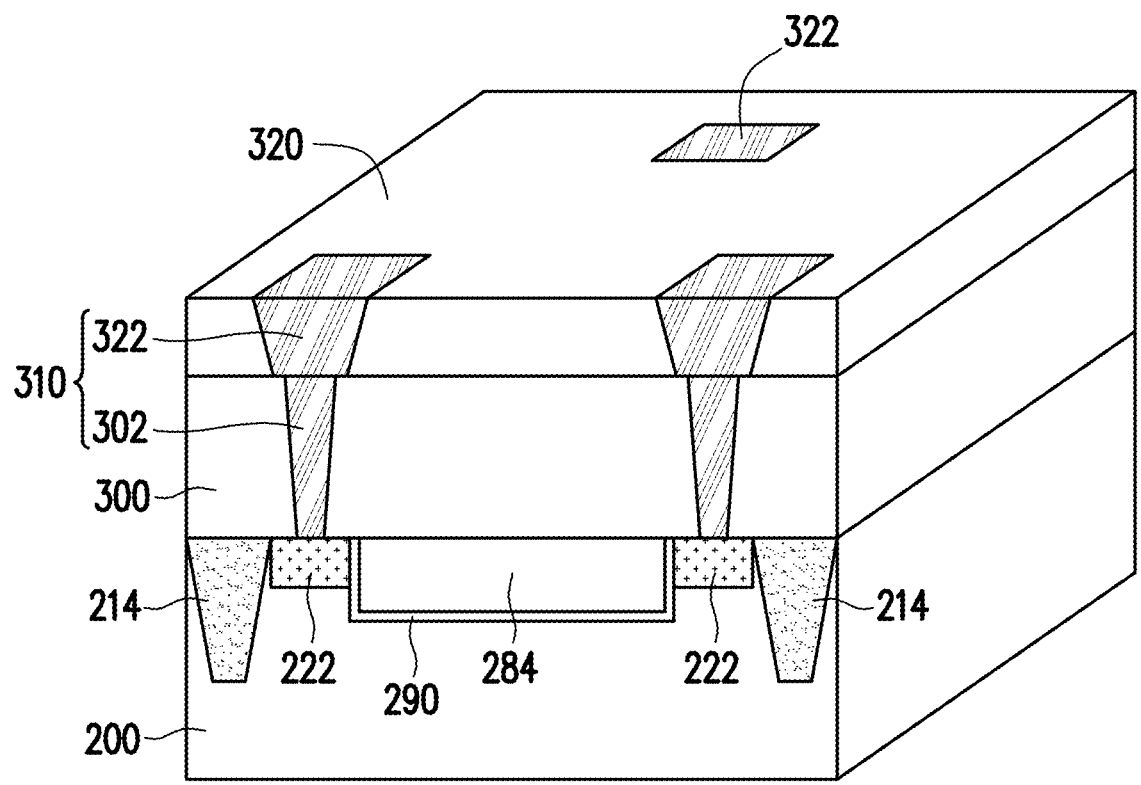
FIG. 21A and FIG. 21B are different views of the substrate after a processing step.
Figure 21B:
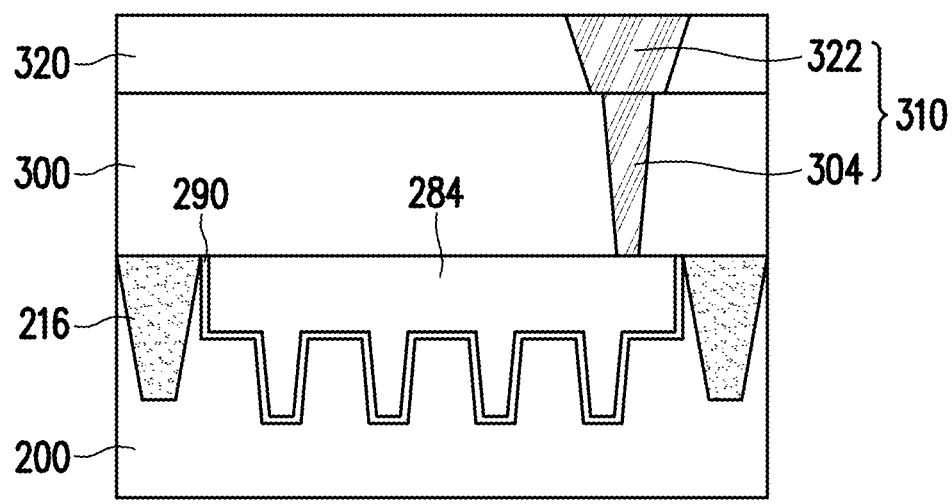

The resulting structure is illustrated in FIG. 21A and FIG. 21B. In this embodiment, the electrical contacts 310 to the source/drain terminals 222 and the gate terminal 284 are formed from the combination of a via 302, 304 and a pad 322.

The transistors of the present disclosure which have a dual-recess structure can be used in high voltage, medium voltage, and low voltage devices on chips. High voltage devices typically operate from about 24 volts (V) to about 32V. Medium voltage devices typically operate from about 6V to about 8V. Low voltage devices usually operate below 1V.

Figure 22:
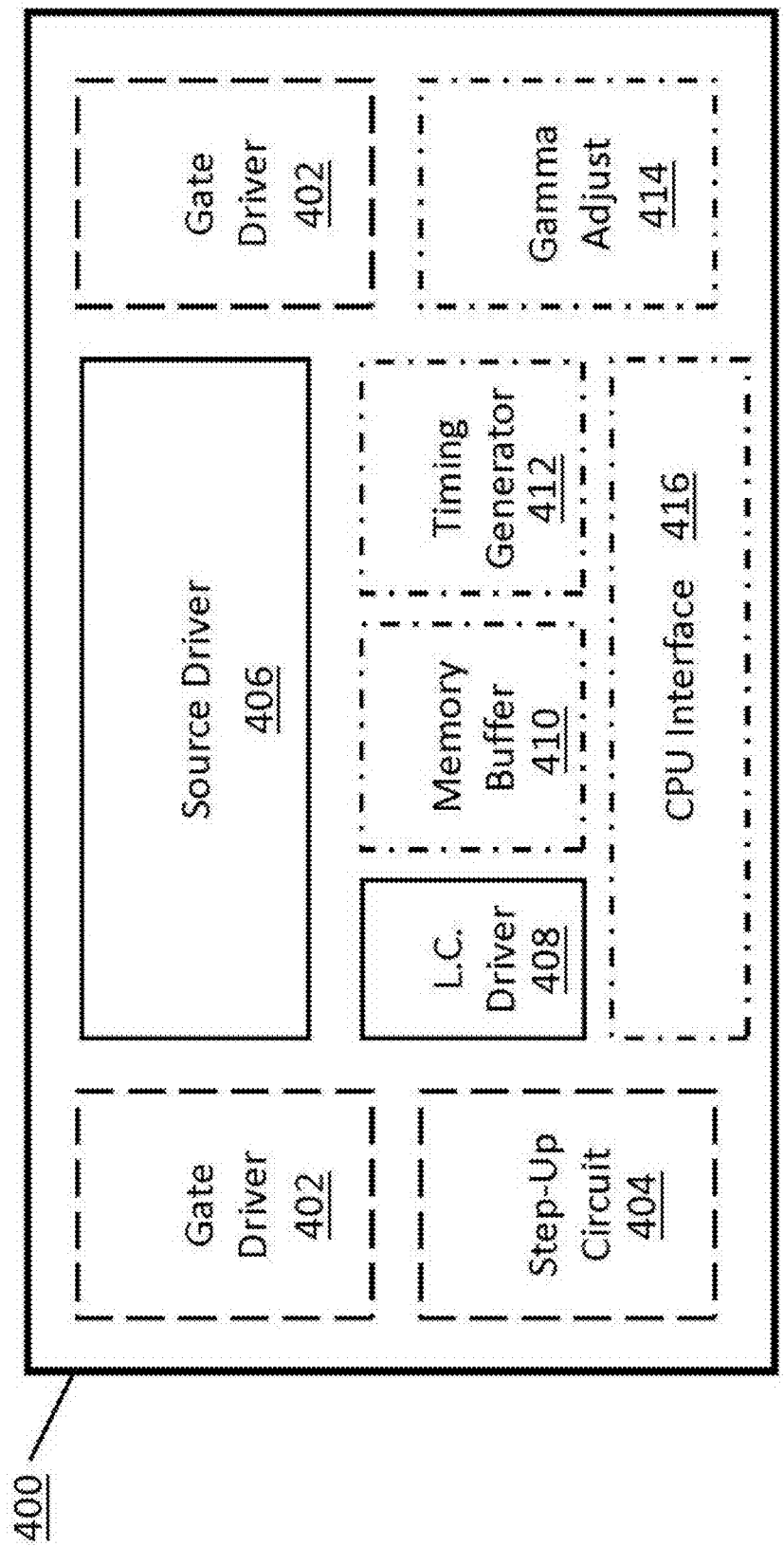
FIG. 22 is a schematic diagram of a display driver integrated circuit (DDIC).

FIG. 22 is a diagram illustrating the various components that may be present in a display driver integrated circuit (DDIC) or a touch and display driver integration (TDDI) circuit. In this regard, high voltage, medium voltage, and low voltage components are integrated onto the same chip 400. This can be helpful for reducing communication losses between the various components. The DDIC/TDDI circuit provides an interface between a microcontroller/computer and the display device itself. For example, these ICs may be used in LCD, OLED, AMOLED, or QLED display panels.

High voltage components include the gate drivers 402 and the step-up circuit 404 (illustrated with dashed line). Medium voltage components include the source driver 406 and the liquid crystal (LC) driver 408 (illustrated with solid line). Low voltage components include the memory buffer 410, the timing generator 412, the gamma adjuster 414, and the CPU interface 416 (illustrated with long-short lines).

A gate driver controls the transistors within each pixel in a row of the display panel. The source driver generates voltages that are applied to the liquid crystal within each pixel (column) on that row for data input. The combination determines the grayscale and color generated by each pixel. The timing generator analyzes the signal from the CPU, converts it to a signal that the gate drivers and source drivers understand, and controls the timing for when the various components send their signals to the display panel, so that the desired image is generated. The step-up circuit increases the input voltage to a higher output voltage and regulates the output voltage so that it remains constant. The LC driver controls the orientation of the liquid crystal layer within the pixel, which determines whether light passes through the pixel or not, and aids in contrast. The memory buffer is used to store the data that determines what is and will be shown on the display panel, and is used to drive the gate drivers and source driver. The gamma adjuster changes the applied voltage to each pixel to obtain the desired luminance and optimize image quality. The CPU interface permits the DDIC/TDDI circuit to communicate with the microcontroller/computer.

The transistors of the present disclosure have several advantages. They can sustain multiple different voltages ranging from low voltages to high voltages, which provides design flexibility. The manufacturing process is simplified and reduces costs. Device performance can be improved. For example, lower leakage occurs, which is desirable for power-constrained applications such as mobile phones.

Some embodiments of the present disclosure thus relate to methods for increasing the saturation drain current of a transistor. Such methods provide a gate terminal having a dual-recess structure. The substrate is etched to form a longitudinal trench. The longitudinal trench is then further etched to form a plurality of lateral trenches in the longitudinal trench, wherein the longitudinal trench and the plurality of lateral trenches together define a gate volume. A gate oxide layer is formed in the gate volume. A gate material is deposited in the gate volume to form a gate terminal.

Other alternative embodiments of the present disclosure also relate to methods for increasing the saturation drain current of a transistor. A pair of parallel isolation regions is formed in a substrate, and define an active region between the isolation regions. A source terminal and a drain terminal are formed adjacent the isolation regions. A hard mask layer is deposited over the active region. Etching is performed through the hard mask layer and into the substrate to form a recess parallel to the source region and the drain region. A plurality of trenches is then formed by etching in a lower surface of the recess which extend between the source terminal and the drain terminal, the recess and the plurality of trenches defining a gate volume. Optionally, ion implanting below the gate volume may be formed. A gate oxide layer is formed in the gate volume. A gate material is deposited in the gate volume to form a gate terminal. Planarizing is then performed to remove the hard mask layer from the active region. This exposes the source terminal, the drain terminal, and the gate terminal. A first insulating layer is formed over the active region. Etching is performed to form vias through the first insulating layer to the source terminal, the drain terminal, and the gate terminal. The vias are filled with an electrically conductive material to form a source contact, a drain contact, and a gate contact.

Other alternative embodiments of the present disclosure also relate to methods for increasing the saturation drain current of a transistor. An isolation region is formed in a substrate to define an active region. The active region is divided into a first portion and one or more second portions. The first portion of the active region is recessed, such that the top surface of a second portion of the active region is higher than the top surface of the recessed first portion of the active region. A plurality of trenches is then formed in the top surface of the recessed first portion of the active region. Together, the recessed first portion and the plurality of trenches define a gate volume. A gate structure is then formed in the gate volume. Source/drain terminals are then formed in the second portions of the active region.

Still further alternative embodiments of the present disclosure also relate to methods for increasing the saturation drain current of a transistor. A pair of parallel trenches is etched in a substrate. The pair of parallel trenches is filled with a dielectric material to form isolation regions and define an active region between the isolation regions. Ions may be implanted in a source region and a drain region adjacent the isolation regions to form a source terminal and a drain terminal. A pad oxide layer is deposited over the active region. A nitride layer is deposited on the pad oxide layer. A capping oxide layer is deposited on the nitride layer. Etching is performed through the capping oxide layer, the nitride layer, and the pad oxide layer and into the substrate to form a recess parallel to the source region and the drain region. A plurality of trenches is then formed by etching in a lower surface of the recess which extend between the source region and the drain region, the recess and the plurality of trenches defining a gate volume. Optionally, ion implanting below the gate volume may be formed. A gate oxide layer is formed in the gate volume. A gate material is deposited in the gate volume to form a gate terminal. Planarizing is then performed to remove the capping oxide layer, the nitride layer, and the pad oxide layer from the active region. This exposes the source terminal, the drain terminal, and the gate terminal. A first insulating layer is formed over the active region. Etching is performed to form vias through the first insulating layer to the source terminal, the drain terminal, and the gate terminal. The vias are filled with an electrically conductive material. A second insulating layer may be formed over the active region. Etching is then performed through the second insulating layer to form pads over the vias. The pads are then filled with an electrically conductive material to form a source contact, a drain contact, and a gate contact.

Other embodiments of the present disclosure relate to integrated circuits, such as a display driver integrated circuit, that include a transistor. The transistor comprises a source terminal, a drain terminal, and a gate terminal formed in a substrate. The gate terminal is located between the source terminal and the drain terminal. The gate terminal comprises a longitudinal trench and lateral trenches below the longitudinal trench.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLES

Devices with a gate width of 10 micrometers (μm) were made. The gate of the Control Device had a flat bottom surface. The gate of Experimental Device One included 16 lateral trenches with a width of 0.3 μm and a distance between adjacent lateral trenches of 0.3 μm. The gate of Experimental Device Two included 12 lateral trenches with a width of 0.4 μm and a distance between adjacent lateral trenches of 0.4 μm. The saturation drain current ($I_{dsat}$) was measured for each device at (Vg=8V) and (Vb=0V).

Figure 23:
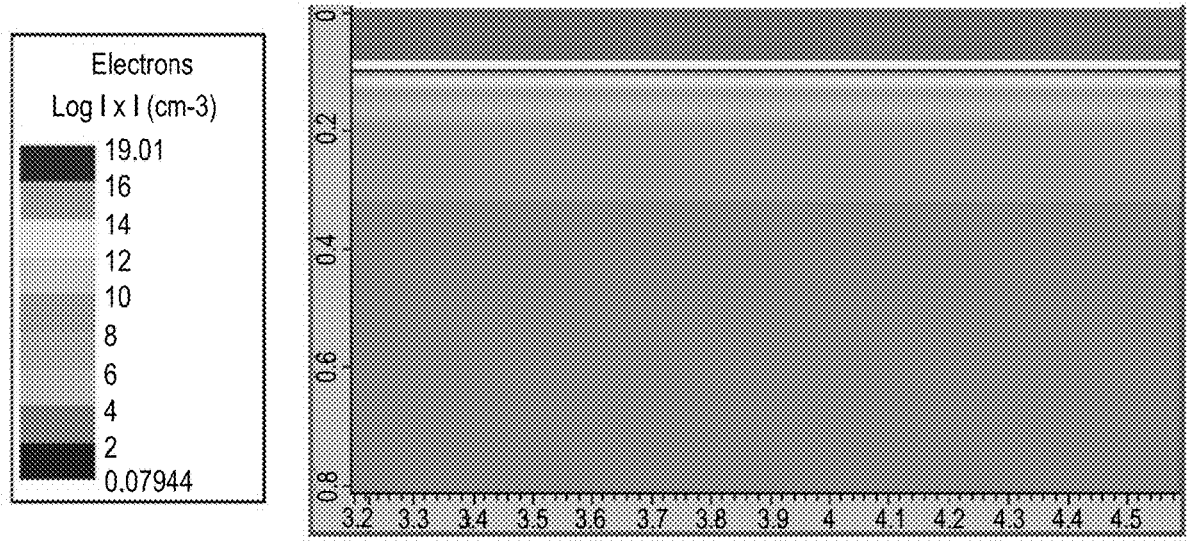
FIG. 23 includes two graphs showing the electron distribution for the Control Device and an Experimental Device. The y-axis is the depth, and the x-axis indicates the location along the gate width.
Figure 23:
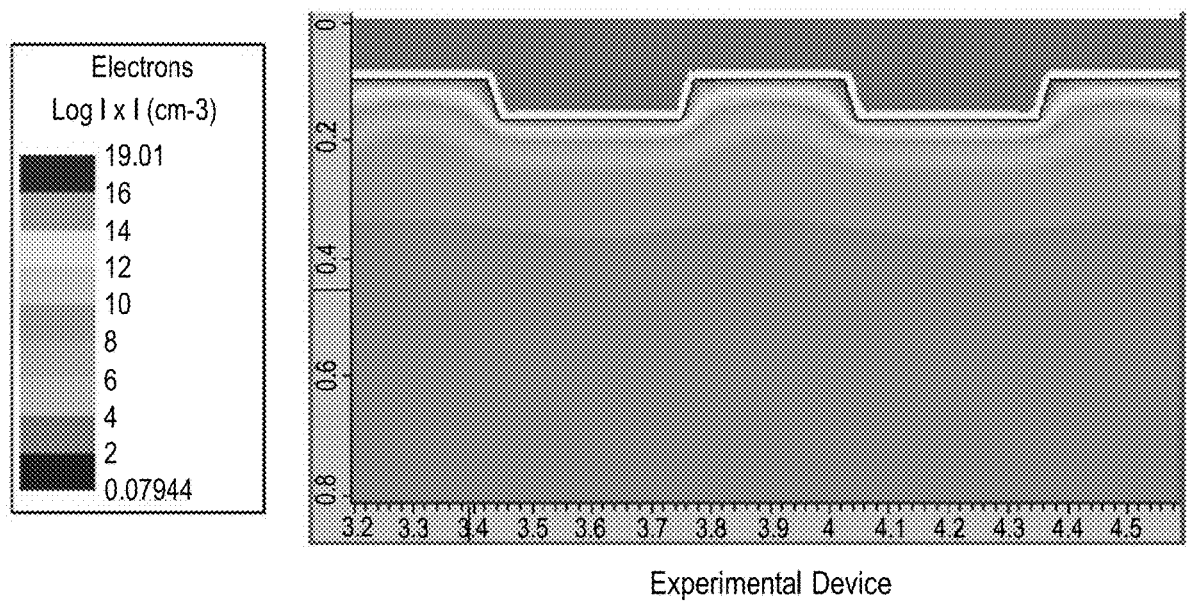

The $I_{dsat}$ of Experimental Device One was about 32% greater than that of the Control Device. The $I_{dsat}$ of Experimental Device Two was about 24% greater than that of the Control Device. FIG. 23 includes two graphs showing the electron distribution for the Control Device and an Experimental Device. More electrons are flowing in the Experimental Device, or in other words the $I_{dsat}$ is higher.

Figure 24:
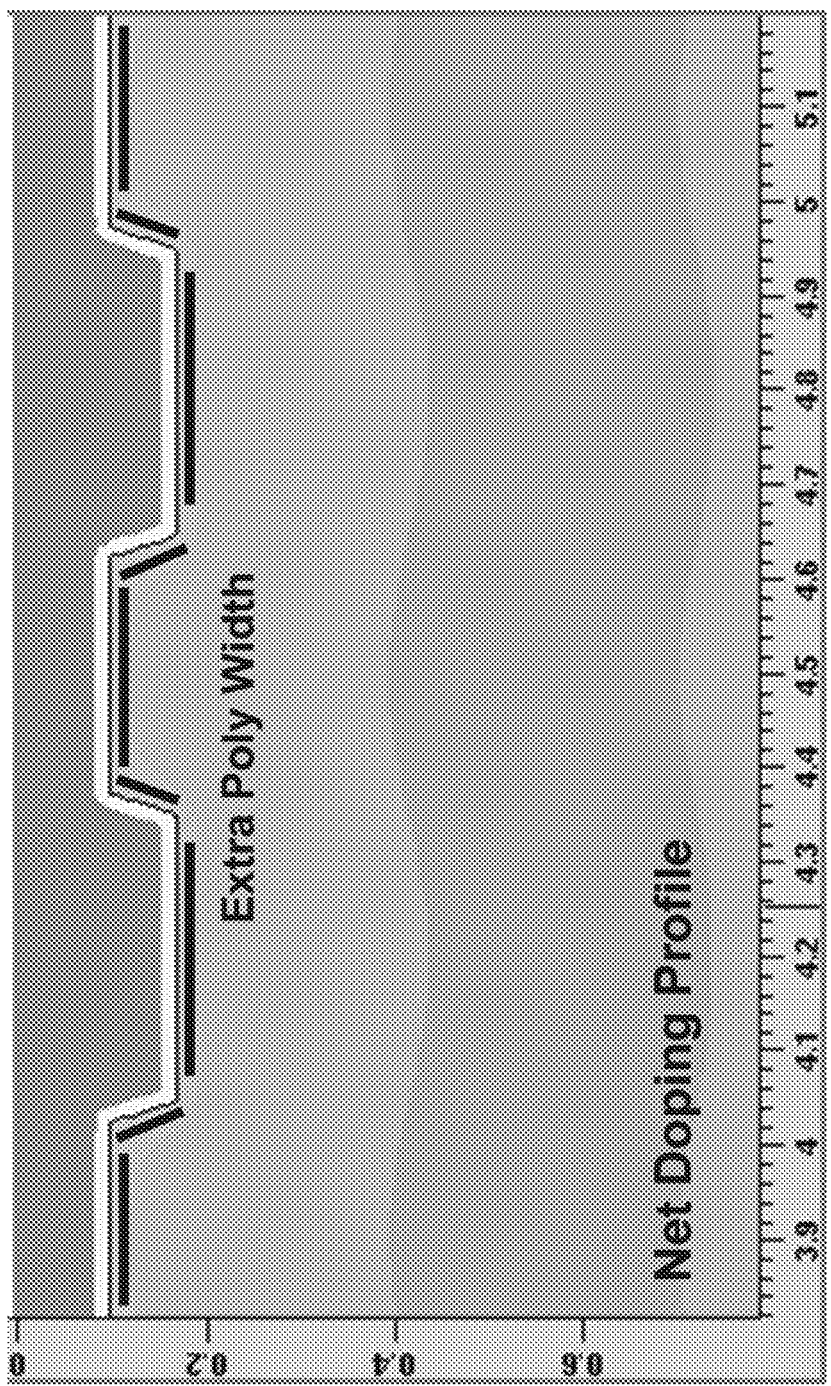
FIG. 24 is a graph showing the projected or expected electron distribution for the Experimental Device. The y-axis is the depth, and the x-axis indicates the location along the gate width.

FIG. 24 is an illustration showing the expected electron distribution for the Experimental Device. Comparing the graph of the Experimental Device in FIG. 23 to this graph, the gate terminal formed from a longitudinal trench and a plurality of lateral trenches performed as expected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for increasing the saturation drain current of a transistor, comprising:
   etching a substrate to form a longitudinal trench that defines a gate region;
   etching the longitudinal trench to form a plurality of lateral trenches in the longitudinal trench, wherein the longitudinal trench and the plurality of lateral trenches together define a gate volume, and wherein the lateral trenches extend between a source terminal and a drain terminal;
   forming a gate oxide layer in the gate volume; and
   depositing a gate material in the gate volume to form a gate terminal.

2. The method of claim 1, wherein the longitudinal trench has a width of from about 0.5 micrometers (μm) to about 20 μm and a depth of from about 0.1 μm to about 0.2 μm.

3. The method of claim 1, wherein each lateral trench has a width of from about 0.02 μm to about 0.5 μm and a depth of from about 0.05 μm to about 0.1 μm.

4. The method of claim 1, wherein adjacent lateral trenches are separated by a width of from about 0.02 μm to about 0.5 μm.

5. The method of claim 1, wherein the plurality of lateral trenches contains from about 12 to about 16 lateral trenches per 10 μm width of the longitudinal trench.

6. The method of claim 1, wherein the gate material comprises polysilicon or a metal.

7. The method of claim 1, wherein the gate oxide layer is formed by thermal oxidation.

8. The method of claim 1, wherein the source terminal and the drain terminal are formed by implanting ions into two regions on opposite sides of the gate region.

9. The method of claim 8, wherein the implanting of ions occurs after the gate terminal is formed.

10. The method of claim 8, further comprising:
    forming an insulating layer over the substrate;
    etching vias through the insulating layer to the source terminal, the drain terminal, and the gate terminal;
    filling the vias with an electrically conductive material to form a source contact, a drain contact, and a gate contact.

11. A method for increasing the saturation drain current of a transistor, comprising:
    forming an isolation region in a substrate to define an active region;
    etching the substrate in the active region to form a longitudinal trench that defines a gate region;
    etching the longitudinal trench to form a plurality of lateral trenches in the longitudinal trench, wherein the longitudinal trench and the plurality of lateral trenches together define a gate volume, and wherein the lateral trenches extend between two source/drain regions on opposite sides of the gate region;
    forming a gate oxide layer in the gate volume;
    depositing a gate material in the gate volume to form a gate terminal; and
    forming source/drain terminals in the two source/drain regions.

12. The method of claim 11, wherein the longitudinal trench has a width of from about 0.5 micrometers (μm) to about 20 μm and a depth of from about 0.1 μm to about 0.2 μm.

13. The method of claim 11, wherein each lateral trench has a width of from about 0.02 μm to about 0.5 μm and a depth of from about 0.05 μm to about 0.1 μm.

14. The method of claim 11, wherein the plurality of lateral trenches contains from about 12 to about 16 lateral trenches per 10 μm width of the longitudinal trench.

15. The method of claim 11, wherein the source/drain terminals are formed by ion implantation.

16. The method of claim 11, further comprising:
    forming an insulating layer over the substrate;
    etching vias through the insulating layer to the source/drain terminals and the gate terminal; and
    filling the vias with an electrically conductive material to form a source contact, a drain contact, and a gate contact.

17. A method for increasing the saturation drain current of a transistor, comprising:
    etching a substrate to form a longitudinal trench that defines a gate region between two source/drain regions;
    etching the longitudinal trench to form a plurality of lateral trenches in the longitudinal trench, wherein the longitudinal trench and the plurality of lateral trenches together define a gate volume, and wherein the lateral trenches extend between the two source/drain regions;
    forming a gate oxide layer in the gate volume; and
    depositing a gate material in the gate volume to form a gate terminal.

18. The method of claim 17, further comprising implanting ions into the two source/drain regions to form source/drain terminals after the gate terminal is formed.

19. The method of claim 17, wherein the longitudinal trench has a width of from about 0.5 micrometers (μm) to about 20 μm and a depth of from about 0.1 μm to about 0.2 μm.

20. The method of claim 17, wherein the plurality of lateral trenches contains from about 12 to about 16 lateral trenches per 10 μm width of the longitudinal trench.

\* \* \* \* \*